United States Patent
Kim et al.

(10) Patent No.: US 9,341,678 B2
(45) Date of Patent: May 17, 2016

(54) FAIL-SAFE DESIGNS FOR LARGE CAPACITY BATTERY SYSTEMS

(71) Applicants: Gi-Heon Kim, Superior, CO (US); Kandler Smith, Golden, CO (US); John Ireland, Denver, CO (US); Ahmad A. Pesaran, Boulder, CO (US); Jeremy Neubauer, Denver, CO (US)

(72) Inventors: Gi-Heon Kim, Superior, CO (US); Kandler Smith, Golden, CO (US); John Ireland, Denver, CO (US); Ahmad A. Pesaran, Boulder, CO (US); Jeremy Neubauer, Denver, CO (US)

(73) Assignee: Alliance for Sustainable Energy, LLC, Golden, CO (US)

( * ) Notice: Subject to any disclaimer, the term of this patent is extended or adjusted under 35 U.S.C. 154(b) by 879 days.

(21) Appl. No.: 13/628,208

(22) Filed: Sep. 27, 2012

(65) Prior Publication Data

US 2013/0113495 A1    May 9, 2013

Related U.S. Application Data

(60) Provisional application No. 61/590,143, filed on Jan. 24, 2012, provisional application No. 61/540,299, filed on Sep. 28, 2011.

(51) Int. Cl.
  *G01N 27/27* (2006.01)
  *G01R 31/36* (2006.01)
  *H01M 10/42* (2006.01)
  *H01M 10/48* (2006.01)
  *B60L 11/18* (2006.01)

(52) U.S. Cl.
  CPC ......... *G01R 31/3606* (2013.01); *H01M 10/425* (2013.01); *H01M 10/482* (2013.01); *B60L 11/1866* (2013.01); *H01M 2010/4271* (2013.01); *H01M 2200/00* (2013.01); *H01M 2220/20* (2013.01); *Y02T 10/7005* (2013.01); *Y02T 10/7061* (2013.01)

(58) Field of Classification Search
  CPC .......................... G01R 31/3606; H01M 10/482
  See application file for complete search history.

(56) References Cited

U.S. PATENT DOCUMENTS

| | | | |
|---|---|---|---|
| 5,496,654 A | 3/1996 | Perkins | |
| 5,625,273 A | 4/1997 | Fehling et al. | |
| 5,739,669 A | 4/1998 | Brülhardt et al. | |
| 5,909,103 A | 6/1999 | Williams | |
| 5,969,503 A * | 10/1999 | Davis | H02J 13/0003 320/118 |
| 6,049,144 A | 4/2000 | Frännhagen et al. | |
| 6,453,249 B1 * | 9/2002 | Shibutani | G01R 31/3679 320/132 |
| 7,157,881 B1 | 1/2007 | Benckenstein, Jr. et al. | |

(Continued)

FOREIGN PATENT DOCUMENTS

| | | |
|---|---|---|
| WO | 00/52807 | 9/2000 |
| WO | 03/041208 | 5/2003 |

OTHER PUBLICATIONS

Jackson, "Battery Circuit Architecture", from 2004 Portable Power Design Seminar, Texas Instruments, 2004, pp. 2-1-2-8.

(Continued)

*Primary Examiner* — Drew A Dunn
*Assistant Examiner* — Steve T Chung
(74) *Attorney, Agent, or Firm* — Michael A. McIntyre

(57) ABSTRACT

Fail-safe systems and design methodologies for large capacity battery systems are disclosed. The disclosed systems and methodologies serve to locate a faulty cell in a large capacity battery, such as a cell having an internal short circuit, determine whether the fault is evolving, and electrically isolate the faulty cell from the rest of the battery, preventing further electrical energy from feeding into the fault.

14 Claims, 20 Drawing Sheets

(56) References Cited

U.S. PATENT DOCUMENTS

| | | | |
|---|---|---|---|
| 7,304,453 | B2 | 12/2007 | Eaves |
| 7,508,171 | B2 | 3/2009 | Carrier et al. |
| 7,659,699 | B2 | 2/2010 | Boebel |
| 7,795,843 | B2 | 9/2010 | Keates et al. |
| 7,800,342 | B2 | 9/2010 | Kobayashi et al. |
| 7,808,131 | B2 | 10/2010 | Hurst et al. |
| 9,030,167 | B2* | 5/2015 | Yamaguchi ......... H01M 10/425 320/117 |
| 2008/0303527 | A1* | 12/2008 | Fechalos ............ G01R 31/3606 324/426 |
| 2009/0206841 | A1* | 8/2009 | Weng ................ G01R 31/3658 324/426 |
| 2009/0325056 | A1 | 12/2009 | Greening et al. |
| 2010/0261043 | A1* | 10/2010 | Kim .................. H01M 10/4207 429/61 |
| 2011/0080139 | A1* | 4/2011 | Troxel ............... H01M 10/4207 320/134 |

OTHER PUBLICATIONS

Smith et al., "Fail Safe Design for Large Capacity Lithium-ion Batteries", NREL Commercialization & Tech Transfer Webinar, Mar. 27, 2011, pp. 1-10, http://techportal.eere.energy.gov/techpdfs/Fail%20Safe%20Design%20for%20Large%20Capacity%20Lithium-ion%20Batteries.pdf.

Kim et al., "Fail-safe design for large capacity lithium-ion battery systems", Journal of Power Sources, 2012, vol. 210, pp. 243-253.

* cited by examiner

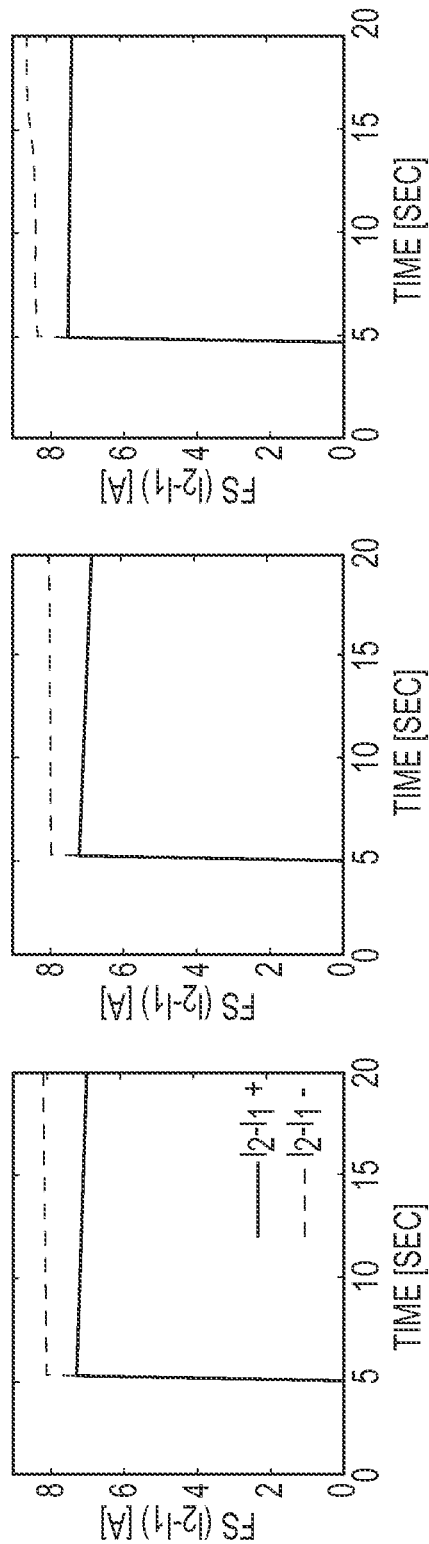

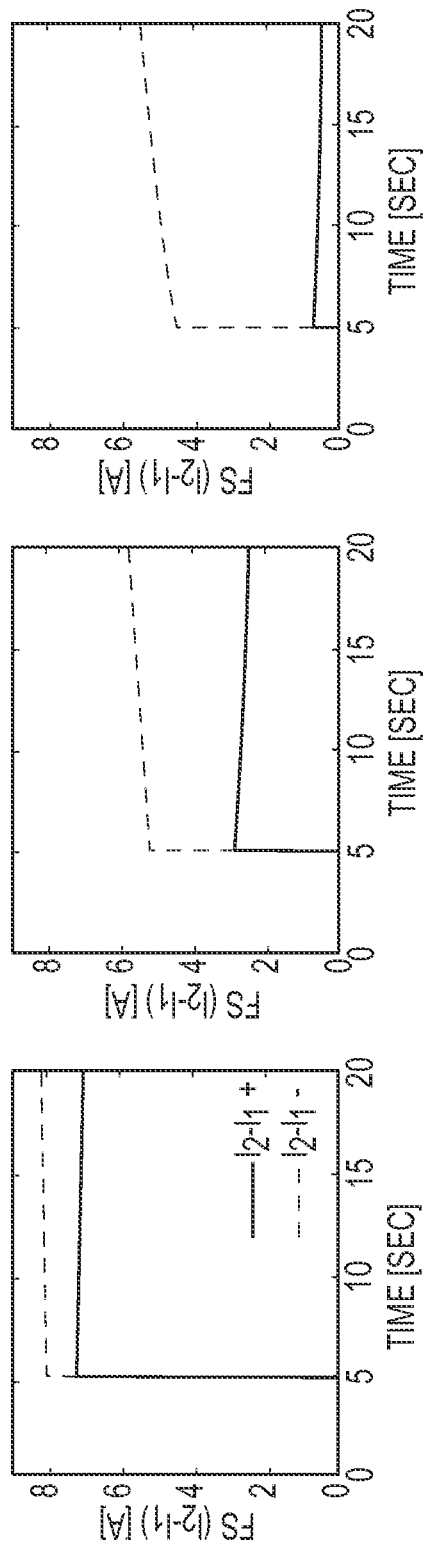

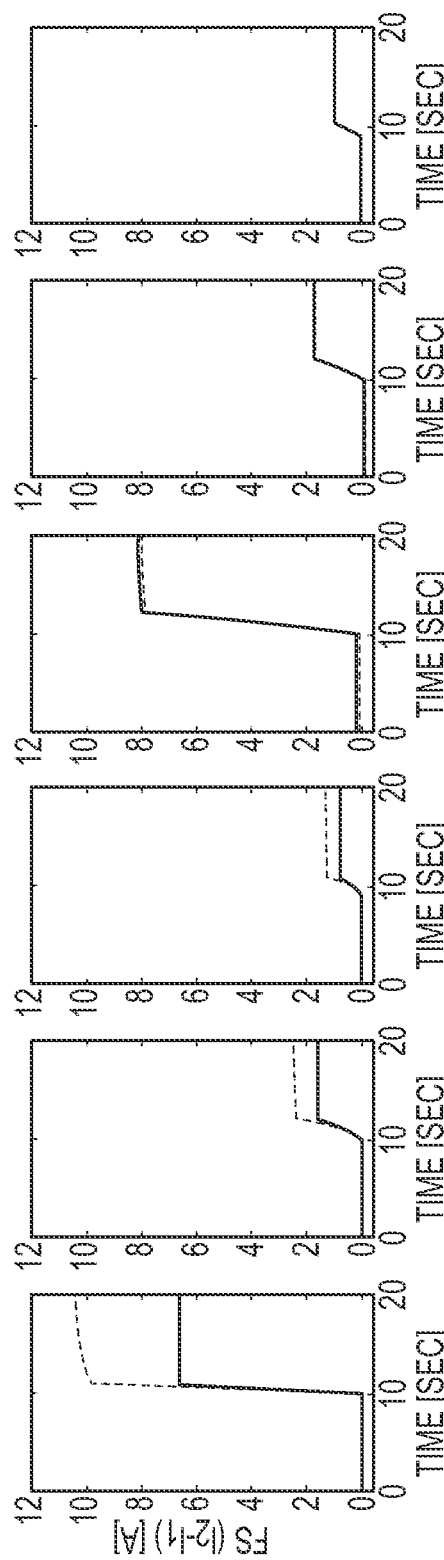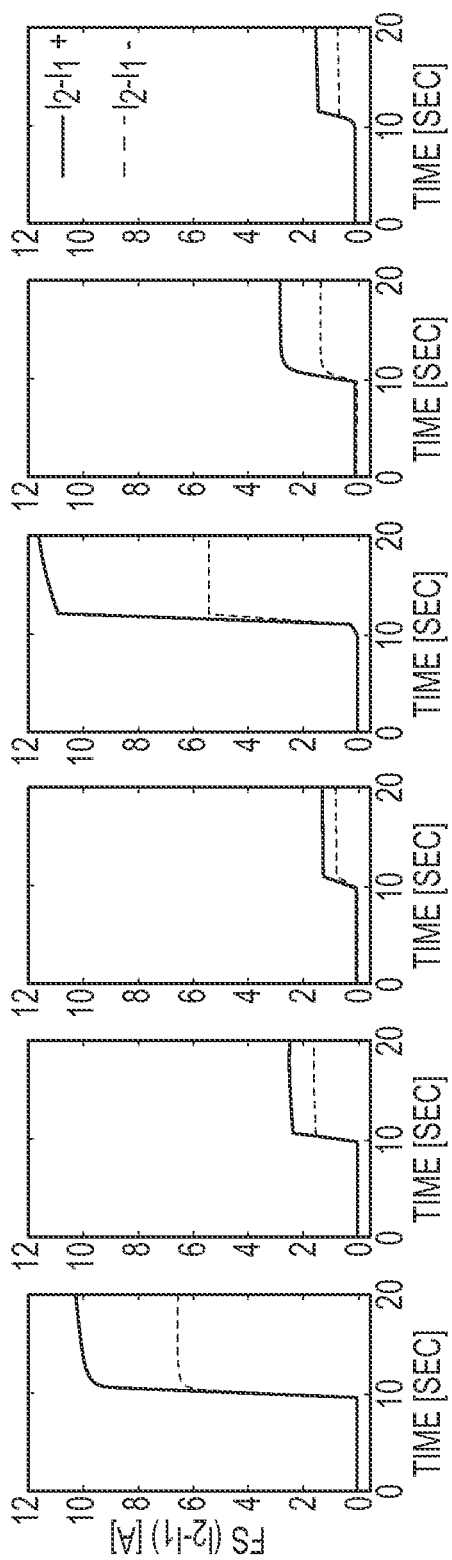

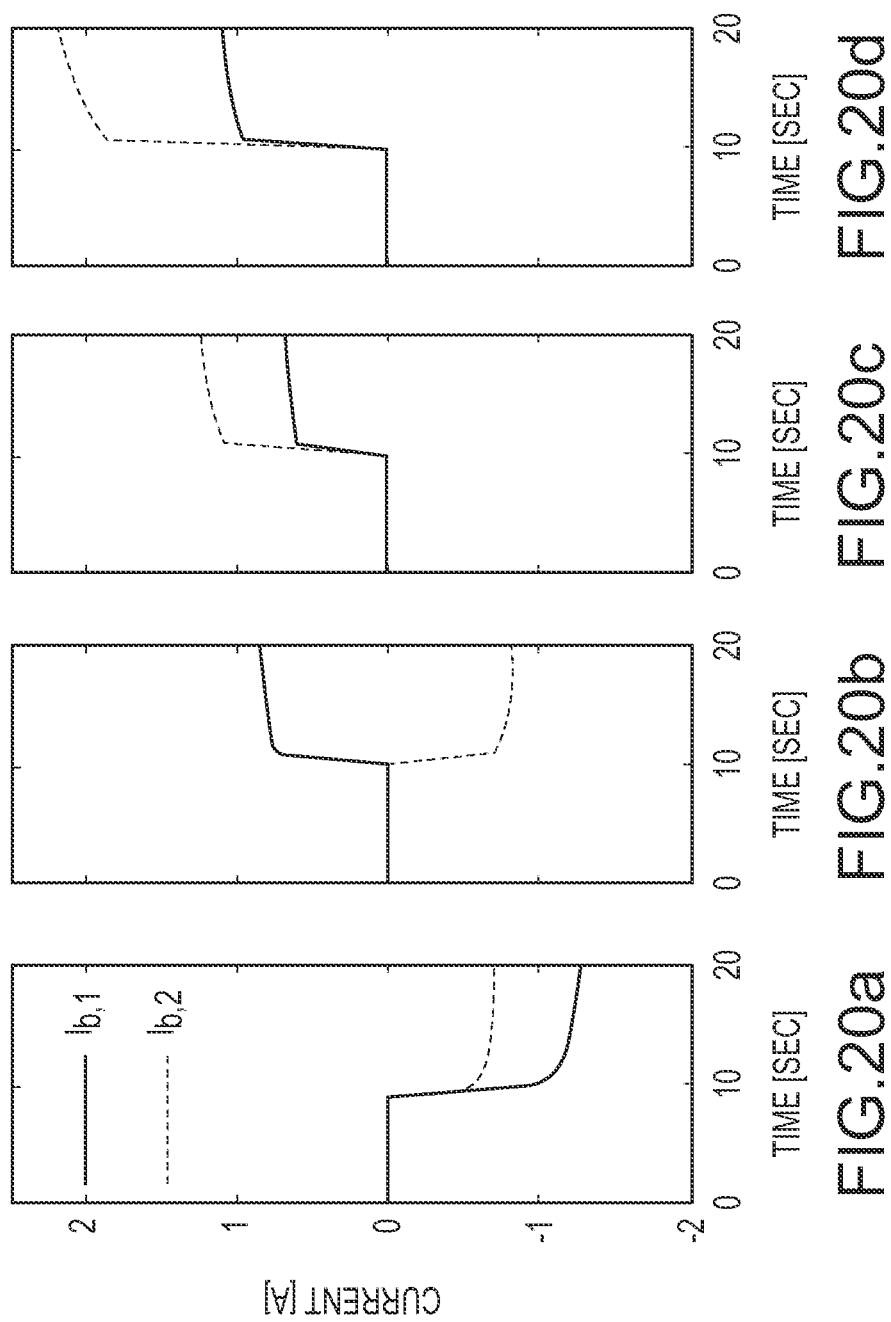

FAIL-SAFE DESIGNS FOR LARGE CAPACITY BATTERY SYSTEMS

CONTRACTUAL ORIGIN

The United States Government has rights in this invention under Contract No. DE-AC36-08GO28308 between the United States Department of Energy and the Alliance for Sustainable Energy, LLC, the Manager and Operator of the National Renewable Energy Laboratory.

BACKGROUND

Large capacity batteries are promising candidates for electric energy storage for electric drive vehicles (EDVs) thanks to their high power and energy density. However, violent incidents reported for this technology, and the consequent safety concerns stemming from such incidents, are still a major hindrance for fast market penetration of large capacity battery powered EDVs. High temperatures can trigger exothermic chemical decompositions of large capacity battery component materials, which then leads to a further increase in temperature and then to a violent failure of the large capacity battery system known as thermal runaway. The unsafe high trigger temperatures may be reached from a variety of failure scenarios including, for example: overcharge of an individual cell or of the entire large capacity battery system; an internal short of cells resulting from a latent defect due to the presence of an internal foreign object, separator wearout, dendrite growth, crush and/or penetration of the cell; an external short of the cell, module or pack; exposure to abnormal high temperature due to failure of neighboring components or fire; and/or combinations of any of the foregoing.

Mature small capacity batteries used in consumer electronics applications ensure safety with multiple redundant layers of incident prevention methods, such as positive temperature coefficient (FTC), current interrupt device (CID), and shutdown separator. Unfortunately, these safety technologies developed for small capacity battery systems do not function properly with large capacity battery systems. The large capacity batteries powering vehicle drive are significantly larger in capacity and physical size than the batteries for personal electronics, and the scaling-up of batteries to large capacity battery systems dramatically changes their behavior under safety incidents such that the safety applications used in small capacity batteries are ineffective with the large capacity batteries scaled up to power EDVs. Large capacity battery systems are typically made by configuring multiple individual cells into a module or a pack both electrically and thermally. Previous attempts to address the anticipated safety issues in large capacity battery systems focused comprehensively at the cell level, and the safety characteristics of large capacity battery systems are often well understood at individual cell level. However, larger batteries, which are a high capacity and high voltage assembly of individual cells, typically change their response greatly to a fault causing unexpected subsequent behaviors. Since pack response is critically affected by pack integration characteristics in a complex relation with the characteristics of unit cells, pack level safety assessment is extremely difficult and expensive in terms of cost and time.

Development of safe large capacity battery systems should include, for example, reliable early detection systems, circuit breaks for excessive currents and reliable shutdown separators, among others. In a large capacity system such as batteries for electric vehicles, detecting a fault signal and confining it locally in a system is extremely challenging. To date, no single system has been developed that has been able to successfully detect fault signals and electrically isolate faults in large capacity batteries.

The foregoing examples of the related art and limitations related therewith are intended to be illustrative and not exclusive. Other limitations of the related art will become apparent to those of skill in the art upon a reading of the specification and a study of the drawings.

SUMMARY

The following embodiments and aspects thereof are described and illustrated in conjunction with systems, tools and methods which are meant to be exemplary and illustrative, not limiting in scope. In various embodiments, one or more of the above-described problems have been reduced or eliminated, while other embodiments are directed to other improvements.

Presented herein are fail-safe systems and design methodologies for large capacity battery systems. In various aspects, analysis of the fail-safe systems and methodologies using pack internal short circuit response models is disclosed in order to demonstrable the viability of the disclosed fail-safe systems and methodologies against various known design parameters and operation conditions. The present disclosure provides data and information showing that locating a faulty cell in a module comprising multiple cells, and determining status of the evolution of the fault, can be achieved using signals easily measured from electric terminals of the module. In various aspects, fail-safe systems and methodologies for electrical isolation of a faulty cell from the rest of healthy cells in a large capacity battery system are disclosed, the fail-safe systems and methodologies being useful to prevent further electrical energy feed into the fault.

In a first aspect, the present disclosure provides a battery pack, comprising a plurality of cells arranged between a positive and a negative terminal; a plurality of power lines that interconnect the plurality of cells in an array of parallel branches; a plurality of balancing lines between the parallel branches, each balancing line configured to carry a balancing current between adjacent branches and each having a resistance that is calibrated to force the balancing current onto the power lines when the balancing current increases due to an internal short circuit in a cell to which that balancing line is connected; and a plurality of current meters connected to the power lines, the plurality of current meters configured to output a plurality of fault signals at least one of which departs from a reference value when the resistance of the balancing lines forces the balancing current onto the power lines.

In some embodiments, the battery pack comprises, in addition to the components disclosed in the preceding paragraph, a plurality of switches, each of which is connected to one of the parallel branches of cells and is configured to open if the fault signal for the branch to which the switch is connected departs from the reference value; wherein when the switch opens, it disconnects a terminal from the parallel branch of cells to which it is connected.

In some embodiments, the battery pack comprises, in addition to the components disclosed in the preceding two paragraphs, a plurality fuses, each of which is connected to one of the balancing lines and is configured to open when the balancing current in the balancing line to which the fuse is attached exceeds a predetermined threshold.

In some embodiments, when a particular switch opens, the balancing current into the cell having an internal short circuit increases beyond the predetermined threshold and causes the fuse attached to the balancing line that carries the increased balancing current to open, electrically isolating the cell with the internal short circuit.

In some embodiments, the fault signal is calculated for each branch of cells as the difference between the current for that branch and the average current for all branches in the array of cells.

In some embodiments, the reference value of the fault signal for each branch in the cell array is zero.

In some embodiments, the plurality of current meters comprises a first set of current meters each of which is connected to one of the parallel branches of cells between a first cell in the parallel branch and the positive terminal, the first set of current meters configured to output a positive fault signal.

In some embodiments, the plurality of current meters comprises a second set of current meters each of which is connected to one of the parallel branches of cells between a last cell in the parallel branch and the negative terminal, the second set of current meters configured to output a negative fault signal.

In some embodiments, the plurality of switches comprises a first set of switches, each of which is connected to one of the parallel branches of cells between a first cell in that branch and the positive terminal, wherein when a particular switch in the first set of switches opens, that switch disconnects the positive terminal from the parallel branch to which the switch is connected.

In some embodiments, the plurality of switches comprises a second set of switches, each of which is connected to one of the parallel branches of cells between a last cell in that branch and the negative terminal, wherein when a particular switch in the second set of switches opens, that switch disconnects the negative terminal from the parallel branch to which the switch is connected.

In a second aspect, the present disclosure provides a battery system comprising: a cell array having a plurality of cells arranged in branches that are connected in parallel; a monitor connected to the cell array such that the monitor receives an input signal for each branch in the cell array and outputs a control signal for each branch in the cell array responsive to the input signals, the monitor configured to assert the control signal for a particular branch if the input to the monitor indicates a fault for that particular branch; and a plurality of switches each of which is connected to one branch in the cell array and connected to the monitor such that the switch receives the control signal as input, each switch being configured to open when the control signal to which that switch is attached is asserted.

In some embodiments, the battery system comprises, in addition to the components of the preceding paragraph, a plurality of current meters each of which is connected to one branch in the cell array, each current meter configured to output a current signal that indicates an amount of current present in the branch to which the current meter is connected; wherein the monitor asserts the control signals based on fault signals that are derived from the current signals output from the current meters.

In some embodiments, the monitor is configured to receive the current signals as input, to calculate the fault signal for each branch in the cell array as the difference between the current for that branch and the average current for all branches in the array of cells, and to assert the control signal on a particular branch if the fault signal for that particular branch departs from a reference value.

In some embodiments, the battery system comprises, in addition to the components of the preceding paragraphs, a circuit element connected to the plurality of current meters and to the monitor, the circuit element configured to output a fault signal for each branch in the cell array, the fault signal being the difference between the current for that branch and the average current for all branches in the array of cells; wherein the monitor is configured to receive the fault signals as input, and to assert the control signal on a particular branch if the fault signal for that particular branch departs from a reference value.

In some embodiments, the battery system comprises, in addition to the components of the preceding paragraphs, a plurality of balancing lines between the parallel branches, each balancing line configured to carry a balancing current between adjacent branches of cells and each having a resistance that is calibrated to force the balancing current onto the power lines when the balancing current increases due to an internal short circuit in a cell to which that balancing line is connected; wherein the balancing current on the power lines causes an increase in the output of at least one, but not all of the current meters.

In some embodiments, the battery system comprises, in addition to the components of the preceding paragraphs, a plurality of fuses on each of the balancing lines, each fuse configured to open when the balancing current in the balancing line to which the fuse is attached exceeds a predetermined threshold.

In some embodiments, when a particular switch opens, the balancing current into the cell having the internal short circuit increases beyond the predetermined threshold and causes the fuse attached to the balancing line that carries the increased balancing current to open, thereby electrically isolating the cell having the internal short circuit.

In some embodiments, the battery system comprises, in addition to the components of the preceding paragraphs, a battery enclosure that encloses the cell array and the monitor.

In some embodiments, the battery system comprises, in addition to the components of the preceding paragraphs, a battery enclosure that encloses the cell array; wherein the monitor is external to the enclosure.

In a third aspect, the present disclosure provides a method of monitoring a battery, comprising: receiving a plurality current signals at a battery monitor from a cell array having a plurality of cells arranged in branches connected in parallel; calculating, by the monitor, a plurality of fault signals based on the current signals, each fault signal being calculated as the difference between the current for a particular branch in the cell array and the average current for all branches in the cell array; and asserting, by the monitor, a control signal for a particular branch in the cell array if the fault signal for that particular branch departs from a reference value; wherein asserting the control signal causes the particular branch to become disconnected from a battery terminal.

In addition to the exemplary aspects and embodiments described above, further aspects and embodiments will become apparent by reference to the drawings and by study of the following descriptions.

BRIEF DESCRIPTION OF THE DRAWINGS

Those skilled in the art will understand that the drawings, described herein, are for illustration purposes only. The drawings are not intended to limit the scope of the present disclosure.

FIG. 5 is an illustration of thermal response of a large capacity battery cell developing a low impedance internal short circuit.

FIG. 6b depicts a schematic of the short-circuit cell model used in the model result comparison depicted in FIG. 6a.

FIG. 7 depicts conceptual diagrams of design facilitating methodologies for enhancement of large capacity battery safety.

FIG. 8 depicts schematics of a multi-cell large capacity battery module configured with two lateral series branches and resistive balancing lines across parallel unit cells.

FIG. 11 depicts Pack internal short circuit simulation results of fault signals (FS) at positive and negative module terminals for $I_{mdl}$=0 A (FIG. 11a), $I_{mdl}$=120 A (FIG. 11b), and $I_{mdl}$=−120 A (FIG. 11c). For all cases, the ISC occurs at 5 seconds in cell (I, 2) of each module with conditions $C_{mdl}$=40 Ah (20 Ah+20 Ah), $N_s$=5 and $R_b$=0.1Ω.

FIG. 12 depicts pack internal short circuit simulation results of fault signals (FS) at positive and negative module terminals for $N_s$=5 (FIG. 12a), $N_s$=10 (FIG. 12b) and $N_s$=20 (FIG. 12c). In each depicted embodiment, the internal short circuit occurs at 5 seconds in cell(1, 2) of each module with conditions $C_{mdl}$=40 Ah (20 Ah+20 Ah), $I_{mdl}$=0 A and $R_b$=0.1Ω.

FIG. 19 depicts experimental results of fault signals (FS) at positive and negative module terminals for a 0.1Ω internal short circuit (FIG. 19a), a 0.5Ω internal short circuit (FIG. 19b), and for a 1Ω internal short circuit (FIG. 19c) induced in cell(1,1) in a module with conditions, $C_{mdl}$=16 Ah (8 Ah+8 Ah), $N_s$=3, $I_{mdl}$=0 A and $R_b$=0.2Ω; FIGS. 19d, 19e and 19f depict experimental results of FS under the same conditions for internal short circuits induced in cell(1,2); same with FIGS. 19g, 19h and 19i for internal short circuits induced in cell(1,3); and same with FIGS. 19j, 19k and 19l for internal short circuits induced in cell(1,3) and $R_b$=0.1Ω.

FIG. 20 depicts experimental results of balance resistor currents for an internal short circuit induced in cell(1,1) (FIG. 20a), in cell(1,2) (FIG. 20b), in cell(1,3) (FIG. 20c) in a module with $R_b$=0.2Ω; same with FIG. 20d for a 0.1Ω internal short circuit induced in cell(1,3) in a module with $R_b$=0.1Ω.

DETAILED DESCRIPTION

Figure 1:
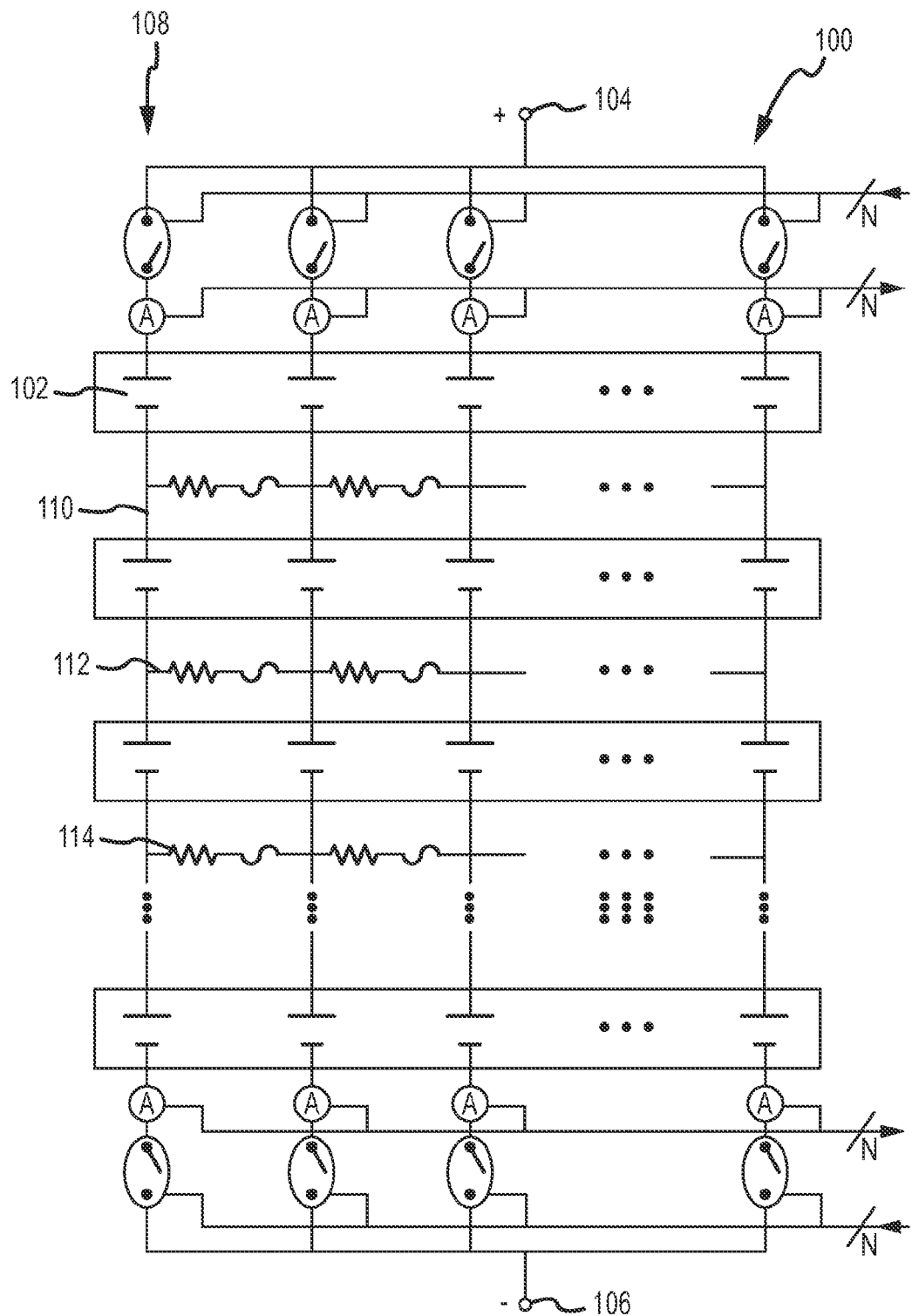
FIG. 1 is a schematic illustration of a high-capacity battery pack in accordance with embodiments of the present disclosure.

Reference is now made in detail to certain embodiments directed to fail-safe systems and design methodologies for large capacity battery systems. In various aspects, the fail-safe systems and methodologies are useful in locating and electrically isolating a fault in large capacity battery systems. The disclosed embodiments are not intended to be limiting of the claims. To the contrary, the claims are intended to cover all alternatives, modifications, and equivalents.

Embodiments discussed herein are directed to fail-safe systems and design methodologies for large capacity battery systems that operate by locating a faulty cell in a module comprising multiple cells and determining a status of the evolution of the fault using signals that are measured from electric terminals of the module. In various aspects, when the disclosed fail-safe systems locate a faulty cell, such as a cell having an internal short circuit, and determines that the fault is evolving, the systems proceed to electrically isolate the faulty cell from the rest of healthy cells in the system. In doing so, the disclosed fail-safe systems prevent further electrical energy from feeding into the fault.

In that respect, the disclosed fail-safe systems provide fail-safe design methodologies for large capacity battery systems and serve to increase the overall safety of large capacity battery systems during operation. For example, in some instances during operation of a large capacity battery system, a fault can be created due to the presence of a latent defect in the battery. This fault can grow over time and, in certain severe instances, lead to thermal runaway of the battery. This can not only cause failure of the battery, but can also create dangerous situations for those in close proximity to the battery, such as an operator of an electric drive vehicle powered by the battery. In this regard, embodiments provided by the present disclosure provide fail-safe systems and methods for early detection of safety faults in large capacity battery systems that facilitate execution of proactive actions effective to minimize subsequent losses. In addition, embodiments provided by the present disclosure can be advantageously employed in large scale battery systems and thus address and overcome the troubles associated with scaling-up of a battery, which change thermal and electrical signals of a system developing a defect and its consequent behaviors during the evolution of a fault. More specifically, embodiments provided by the present disclosure are directed to detecting a fault signal derived from an individual cell in a large capacity battery and electrically isolating the fault from the rest of the large capacity battery system. In some embodiments, the large capacity battery system is a battery or battery pack for an electric vehicle.

The fail-safe systems and design methodologies disclosed herein will work in any large capacity battery system. In that regard, the fail-safe systems can be used with any type of battery, provided that the battery is capable of being scaled up to large capacity. In some embodiments, the battery is selected from a zinc-carbon battery, a zinc-chloride battery, an alkaline (zinc-manganese dioxide) battery, a nickel oxyhydroxide (zinc-manganese dioxide/nickel oxyhydroxide) battery, a lithium ion battery, a mercury oxide battery, a zinc-air battery, a silver-oxide (silver-zinc) battery, a lead-acid battery, a nickel metal hydride battery, a chloroaluminate ($NaAlCl_4$) sodium battery, a nickel cadmium battery, and a nickel zinc battery. In some embodiments, the battery is a lithium ion battery.

In some embodiments, the battery is a lithium ion battery selected from a lithium-copper oxide battery, a lithium-cobalt oxide battery, a lithium-iron disulfide battery, a lithium-iron phosphate battery, a lithium-manganese oxide battery, a lithium-manganese dioxide ($LiMnO_2$) battery, a lithium nickel manganese cobalt oxide battery, lithium nickel cobalt aluminum oxide battery and a lithium titanate battery.

In some embodiments, the battery is a lithium ion battery having a positive electrode material selected from $LiCoO_2$, $LiMn_2O_4$, $LiNiO_2$, $LiFePO_4$, $Li_2FePO_4F$, $LiCo_{1/3}Ni_{1/3}Mn_{1/3}O_2$ and $Li(Li_aNi_xMn_yCo_z)O_2$. In some embodiments, the battery is a lithium ion battery having a negative electrode material selected from Graphite ($LiC_6$), Hard Carbon ($LiC_6$), Titanate ($Li_4Ti_5O_{12}$), Si ($Li_{4.4}Si$) and Ge ($Li_{4.4}Ge$). In some embodiments, the battery is a lithium ion battery having a positive electrode material selected from $LiCoO_2$, $LiMn_2O_4$, $LiNiO_2$, $LiFePO_4$, $Li_2FePO_4F$, $LiCo_{1/3}Ni_{1/3}Mn_{1/3}O_2$ and $Li(Li_aNi_xMn_yCo_z)O_2$; and a negative electrode material selected from Graphite ($LiC_6$), Hard Carbon ($LiC_6$), Titanate ($Li_4Ti_5O_{12}$), Si ($Li_{4.4}Si$) and Ge ($Li_{4.4}Ge$).

This disclosure additionally presents an analysis of the disclosed systems using a pack internal short circuit response model. The analysis demonstrates the viability of the disclosed systems as compared to various known design parameters and operation conditions. This disclosure additionally presents experimental descriptions that support the results of the disclosed systems.

System Overview

With reference to FIG. 1, an example of a large-capacity battery pack in accordance with embodiments of the present disclosure is provided. FIG. 1 depicts a schematic illustration of an array 100 of battery cells 102. The cells are disposed between a positive terminal 104 and a negative terminal 106. The array 100 is arranged as a plurality of branches 108 that are each connected in parallel. Specifically, each branch 108 is connected on one end to the positive terminal 104, and on the other end to the negative terminal 106.

The cells 102 of the array 100 are interconnected by a plurality of power lines 110. Each branch 108 of the array 100 contains a power line 110 that connects the individual cells 102 of the branch 108 in series. The power line 110 additionally connects the branch 108 to the positive terminal 104 and the negative terminal 106. The power lines 110 operate primarily to deliver battery electric power during charge and discharge of a large-capacity battery array 102.

The cells 102 of the array 100 are additionally interconnected by a plurality of balancing lines 112. The balancing lines 112 interconnect corresponding cells 102 in adjacent branches 108. For example, the positive terminals of the first cells 102 in adjacent branches 108 are interconnected by a balancing line 112, the positive terminals of the second cells 102 in adjacent branches 108 are interconnected by a balancing line 112, and so on. The balancing lines 112 function to keep balance within a large-capacity battery array 100 and to maximize material utilization and to elongate the life of the array 100.

The array 100 is a large capacity battery that carries a large current while releasing or storing electric energy. Therefore, to avoid excessive loss causing inefficiency of the array 100, the power lines 110 are designed to be as conductive as possible. However, the balancing lines 108 do not necessarily need to be as conductive as the pathways for carrying battery power current, since balancing current is much smaller in magnitude than typical charge or discharge current of large-capacity batteries. Thus, the balancing lines 112 are relatively resistive in comparison to the power lines 110. In this way, substantially all of the charging and discharging current that enters and exits the array 100 will be carried on the power lines 110, not the balancing lines 112. This difference in resistance is indicated in by resistors 114 shown in FIG. 1 as being associated with the balancing lines 112. It should be appreciated that balancing lines 112 may not necessarily have a discrete, in-line resistor, but rather may be formed with a material that has a higher resistivity when compared to the material used to form the power lines 110. In some embodiments, the balancing lines 112 comprise a discrete, in-line resistor. In some embodiments, the balancing lines 112 are be formed with a material that has a higher resistivity when compared to the material used to form the power lines 110.

The power lines 110 and the balancing lines 112 together form the electrical conduction pathways between cells 102 within the array 100. These electrical conduction pathways differ from the electrical conduction pathways in a conventional large-capacity battery in that the power conducting and balancing functions are separated. In conventional large-capacity battery systems, the same conductive pathways are also used for carrying balance current achieving fast balancing across the systems. In this regard, conventional large-capacity battery cells are typically constructed by mixing electrode active material particles with a conductive agent and coating the composite slurry onto highly conductive metal current collector sheets that are welded to connections with the negative and positive terminal of the cell. Charge transfer reaction occurs at the reaction sites of active particle surfaces to produce an electric current in the system. The electric current is carried through the electric conduction pathways constructed between active particles and an array terminal.

Figure 7A:
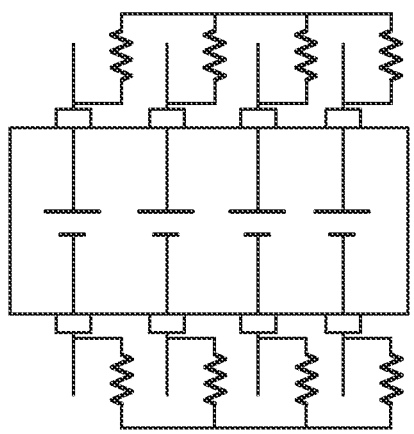
FIG. 7a depicts a laterally-connected configuration and FIG. 7b depicts a cross-connected configuration.
Figure 7B:
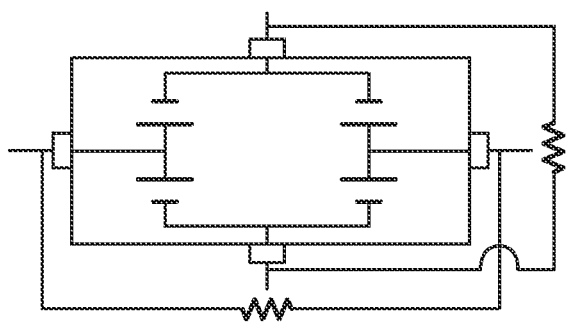

In contrast, large-capacity battery embodiments disclosed herein incorporate both relatively resistive balancing-lines 112 as well as conductive power-lines 110. A large-capacity battery having relatively resistive balancing lines 112 and relatively conductive power lines 110 can be realized in various forms by externally integrating individual unit cells or by having multiple electrically discrete jelly-rolls in a single cell container. This design facilitates methodologies for enhancing the safety of any large capacity battery. FIG. 7 presents two diagrams of embodiments of fail-safe designs for enhancement of the safety of large capacity batteries. FIG. 7a depicts a large-capacity battery having relatively resistive balancing lines 112 and relatively conductive power lines 110 in a laterally-connected configuration. FIG. 7b depicts a large-capacity battery having relatively resistive balancing lines 112 and relatively conductive power lines 110 in a cross-connected configuration.

Aggrandizing Fault Signal in Large Capacity Batteries

Figure 8A:
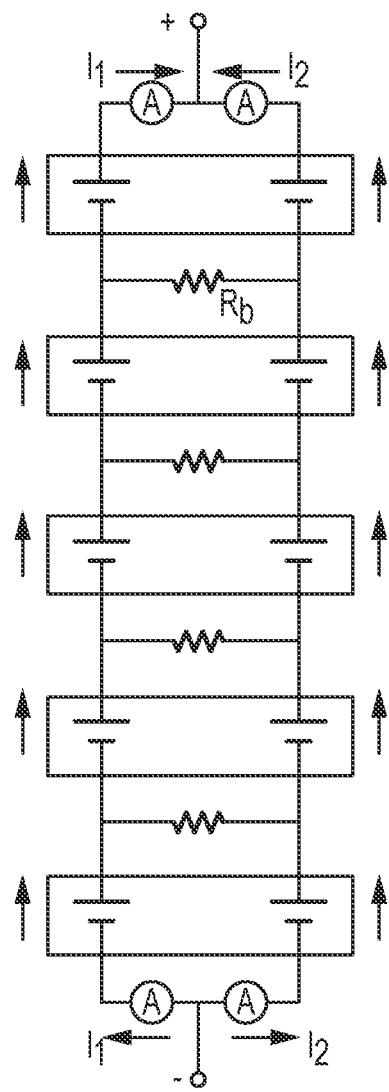
FIG. 8a depicts a module discharge current flow in a well balanced module.
Figure 8B:
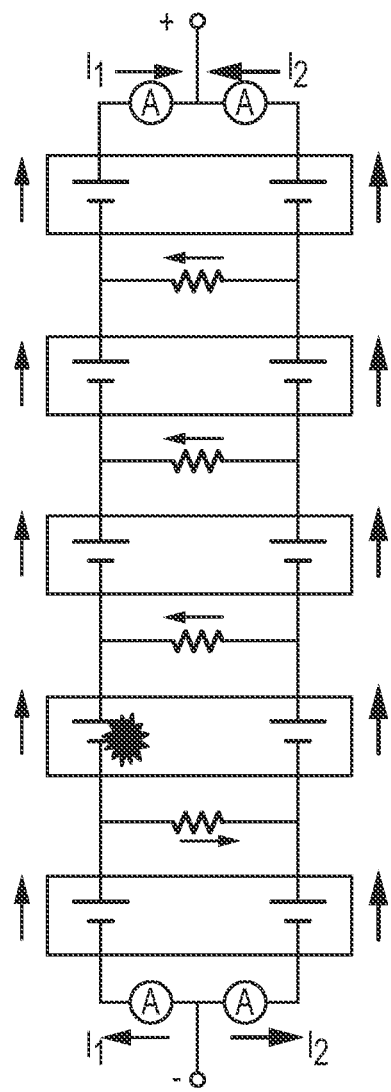
FIG. 8b depicts a module discharge current flow in a module developing an internal short circuit.

FIG. 8 illustrates an embodiment of a fail-safe concept according to the present disclosure, configured with two lateral series branches (see, e.g., FIG. 7a) and resistive balancing lines connecting parallel cell elements. The design with two lateral series branches is chosen here for ease of explanation, though the general concept extends to any number of branches connected in parallel using resistive balancing lines as disclosed herein. Illustrations of module discharge current flow are shown for a well-balanced module in FIG. 8a, and for a module developing an internal short circuit (ISC) in FIG. 8b. In a balanced, healthy battery module (FIG. 8a) the two conductive series branches carry identical amounts of electric current, so that the current measured from each series branch is the same at both the positive and the negative terminals of the module. On the other hand, when an ISC is induced in one of the cells integrated in the module (FIG. 8b), the terminal currents measured from the series branches will depart from the balance. In the depicted embodiment, the ISC in FIG. 8b is displayed in the $2^{nd}$ cell in series from the negative terminal in the left series branch. Since the resistive parallel connections of the module may not be able to offset the abrupt imbalance immediately carrying relatively small current, a significant portion of the balancing current will flow along the conductive series connection loop, aggrandizing the fault signal at the module terminals. The increase in current is shown in FIG. 8b on the right hand side of the right series branch in bold arrows.

As set forth in greater detail below, in various aspects, the fault signals disclosed herein, which are applicable in large capacity batteries, are measured as a departure of terminal current from its balance. For any number of parallel branches, the fault signal is the difference between each branch current and the average current of all branches, wherein the average is calculated as the total current divided by the total number of branches present in the battery.

Figure 2:
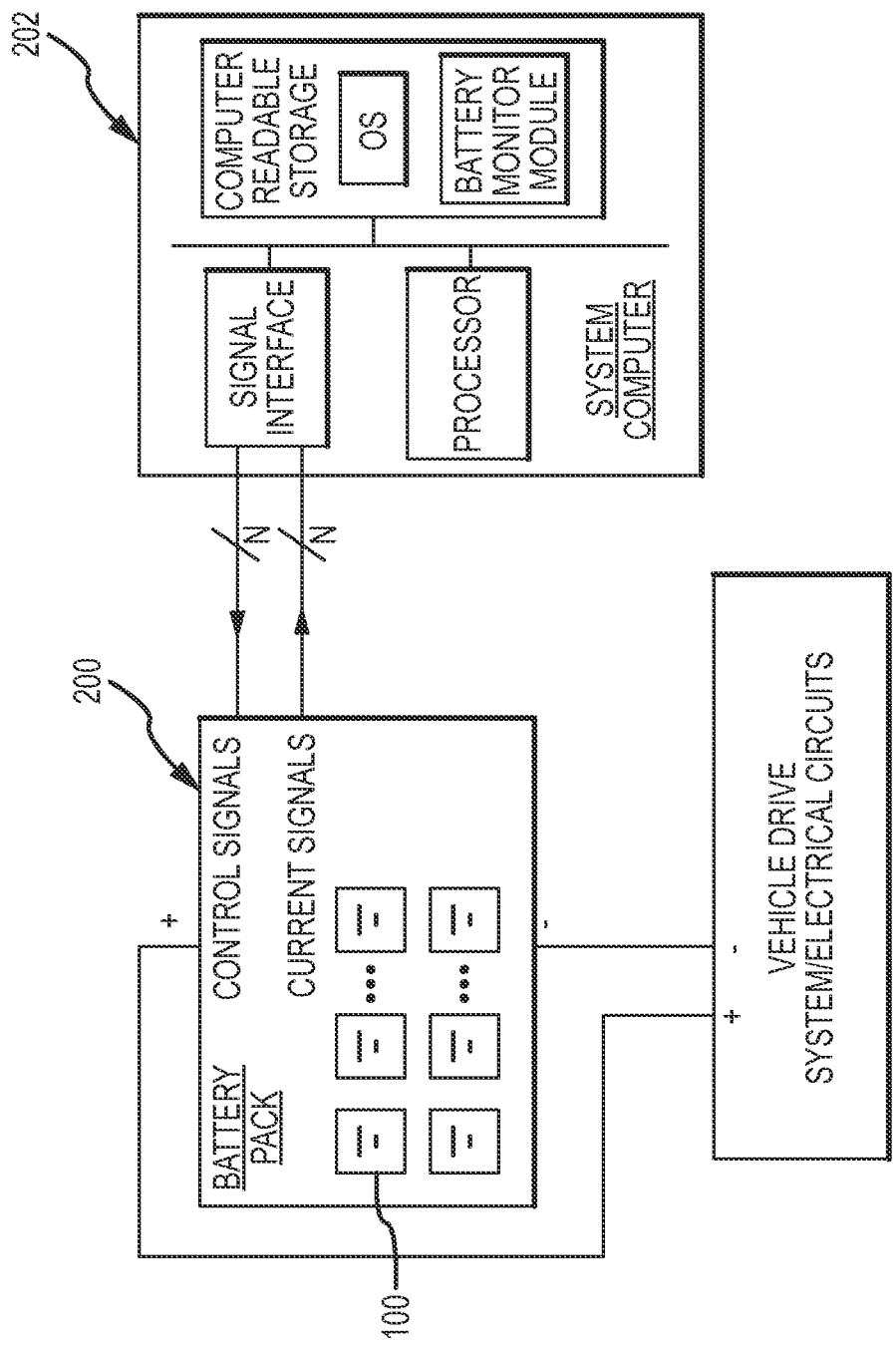
FIG. 2 is a block diagram of a vehicle system that incorporates a large capacity battery array in accordance with embodiments of the present disclosure.

FIG. 2 is a block diagram of a vehicle system that incorporates a large-capacity battery array 100 in accordance with embodiments disclosed herein. The large-capacity battery array 100 is incorporated in a battery 200 that communicates with a system monitor 202. The system monitor 202 receives current signals from the battery 200. The system monitor 200 processes the current signals received from the battery 200 and calculates fault signals. The system monitor 200 then produces control signals based on the calculated fault signals. In the depicted embodiment, the system monitor 200 is the vehicle's computer, however the system monitor 200 can be any device that is capable of receiving current signals, calculating fault signals, and also producing control signals. Each of these signal types (current, fault and control) are described in greater detail below.

Figure 3:
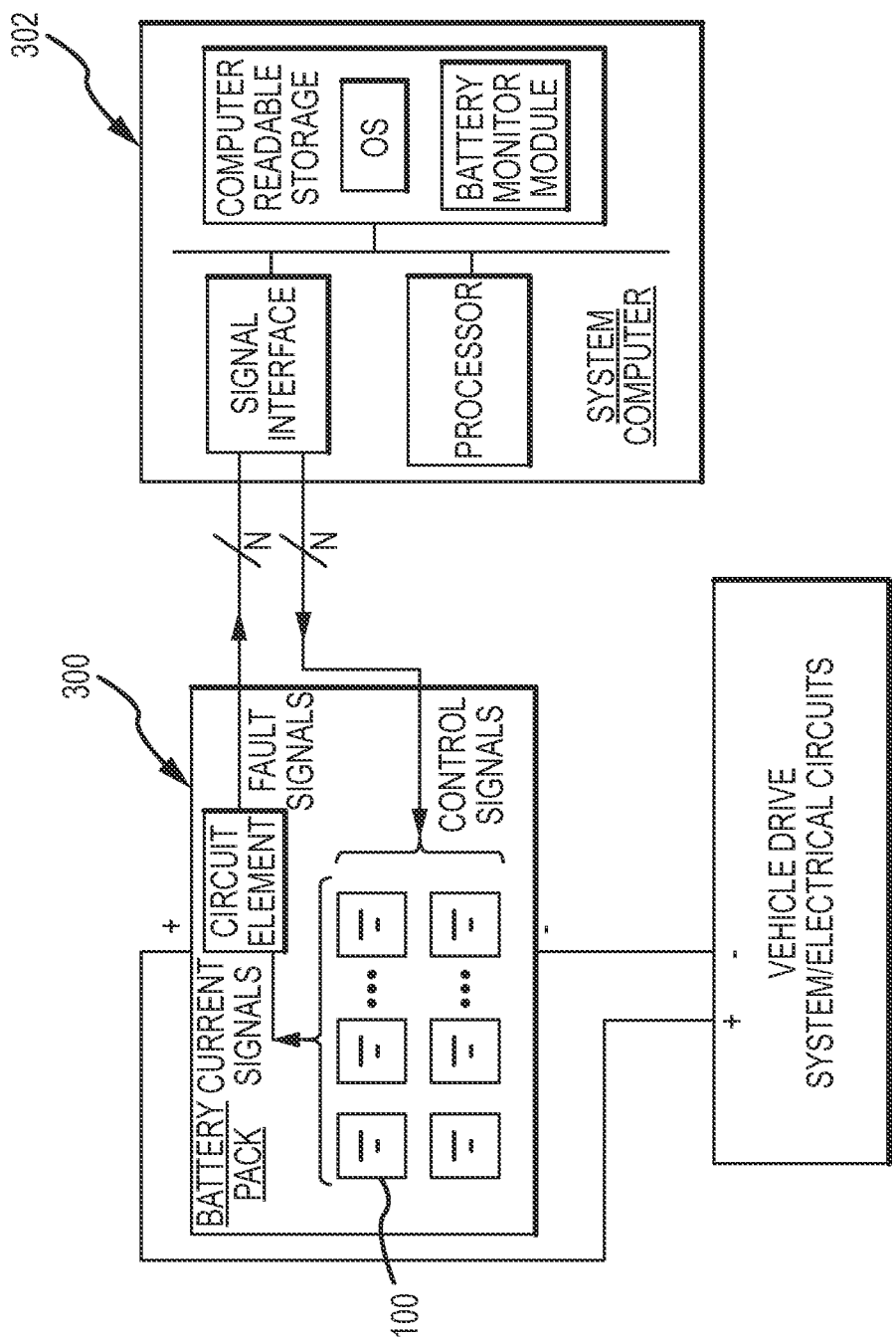
FIG. 3 is a block diagram of another vehicle system that incorporates a large capacity battery array in accordance with embodiments of the present disclosure.

FIG. 3 is a block diagram of another vehicle system that incorporates a large-capacity battery array 100 in accordance with embodiments disclosed herein. The large-capacity battery array 100 is incorporated in a battery 300 that communicates with a system monitor 302. The system monitor 302 receives fault signals from the battery 300. The system monitor 300 processes the fault signals to produce control signals.

Figure 4:
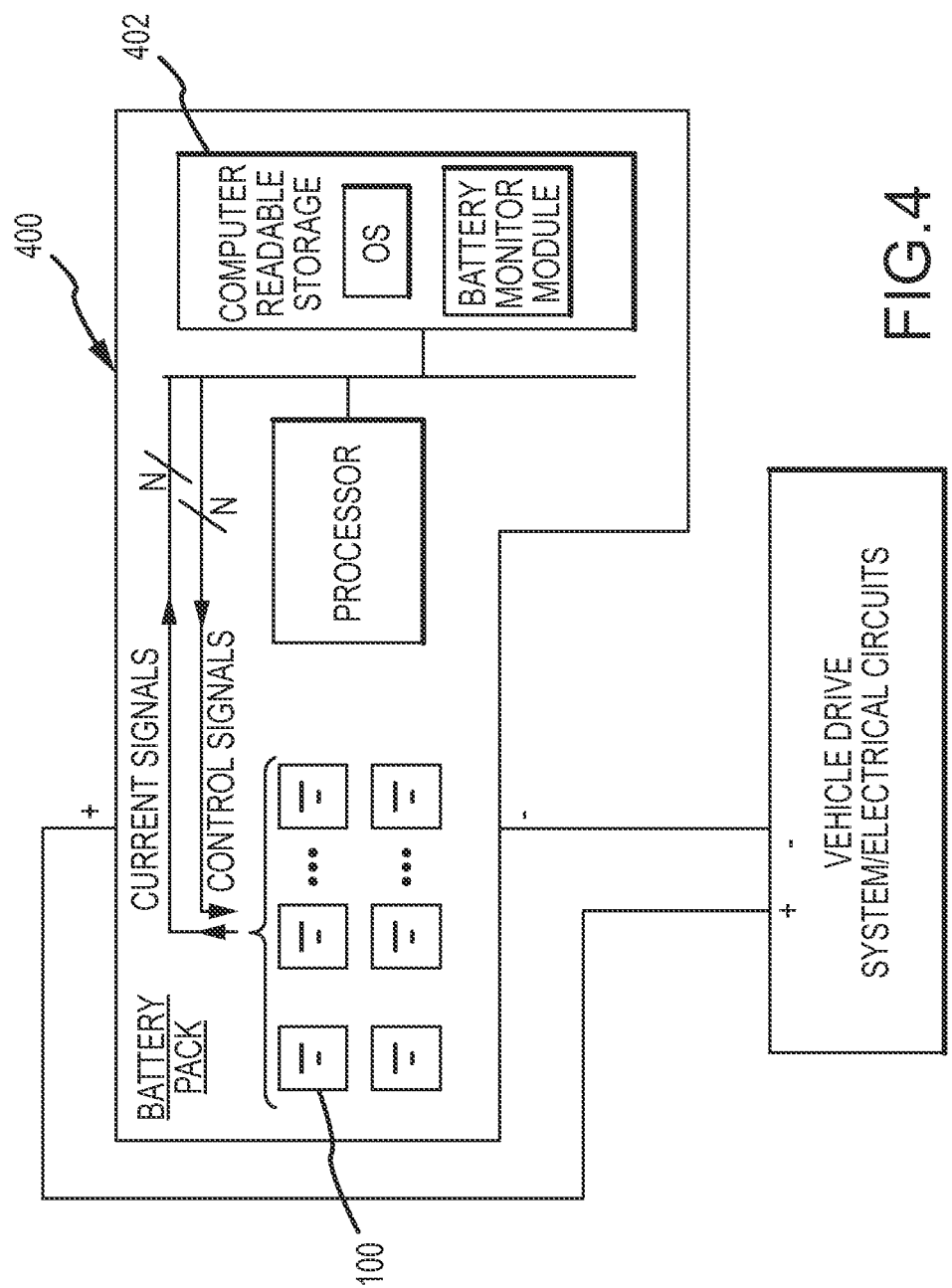
FIG. 4 is a block diagram of still another a vehicle system that incorporates a large capacity battery array in accordance with embodiments of the present disclosure.

FIG. 4 is a block diagram of still another vehicle system that incorporates a large-capacity battery array 100 in accordance with embodiments discussed herein. The large-capacity battery array 100 is incorporated in a battery 400 that includes an integrated monitor 402.

Fault Signal

Early Detection

It is generally believed that a fault that leads to a field accident of a large-capacity battery grows from a latent defect over time. Therefore, significant efforts have been invested to develop methodologies to detect safety faults of large-capacity batteries in their early stage, before they can cause a field accident. Early detection of the safety faults will allow execution of proactive actions that will serve to minimize subsequent losses.

Figure 5A:
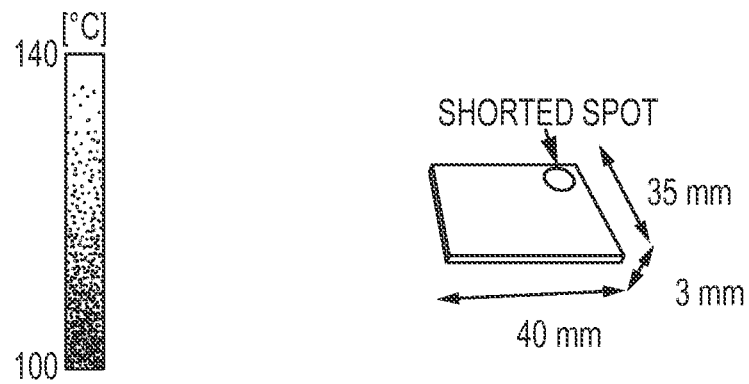
FIG. 5a depicts a simulated temperature field at 8 seconds after the internal short circuit occurrence in a. 0.4 Ah stacked prismatic cell.

However, detecting the fault signals in large-capacity battery systems is much more difficult than in small-capacity battery systems. The thermal response of a battery cell that is developing an internal short circuit (ISC) varies substantially with its size and capacity. In small capacity cells, the entire cell volume can be heated up with a low resistance ISC, due to the high rate electrical discharge heat. This is illustrated in FIG. 5a.

Figure 5B:
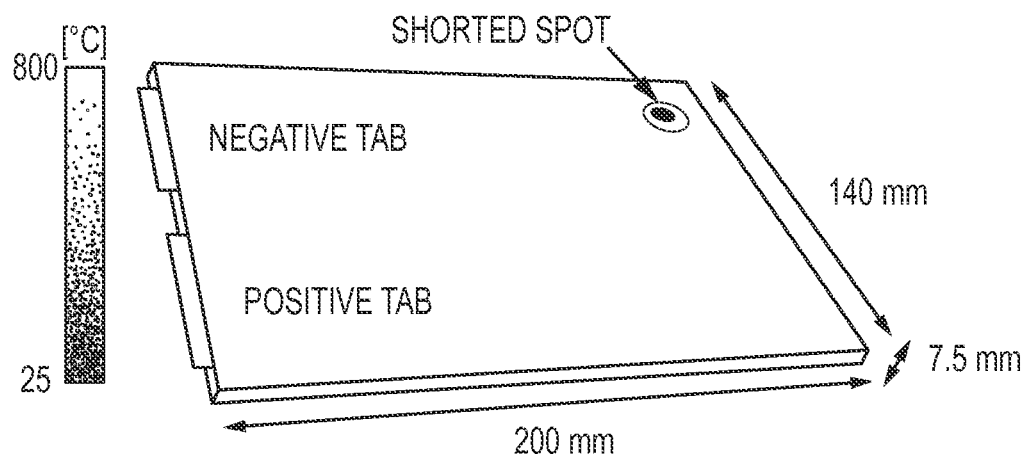
FIG. 5b depicts a simulated temperature field at 10 seconds after the internal short circuit occurrence in a 20 Ah stacked prismatic cell.

In large capacity cells, however, a highly localized temperature excursion is far more likely to occur initially in a localized manner, at the region close to ISC, due to large electrical current convergence. For the large cell, most of the cell volume that is not located in close proximity to the ISC remains at a normal operating temperature range, as shown in FIG. 5b. Because of the localized heating pattern for an ISC, probing a temperature change as a fault signal in large capacity cells requires exceptionally high resolution spatial sensing, which is impractical to apply in production of large-capacity battery systems due to both cost and space restraints.

Because individual cell voltages are typically well monitored in large-capacity batteries for cell balancing purposes, it has been proposed to utilize the existing voltage signals for detection of safety faults occurring in a large capacity battery system. However, scaling up battery capacity deteriorates the viability of using these voltage signals for early stage fault detection.

Figure 6A:
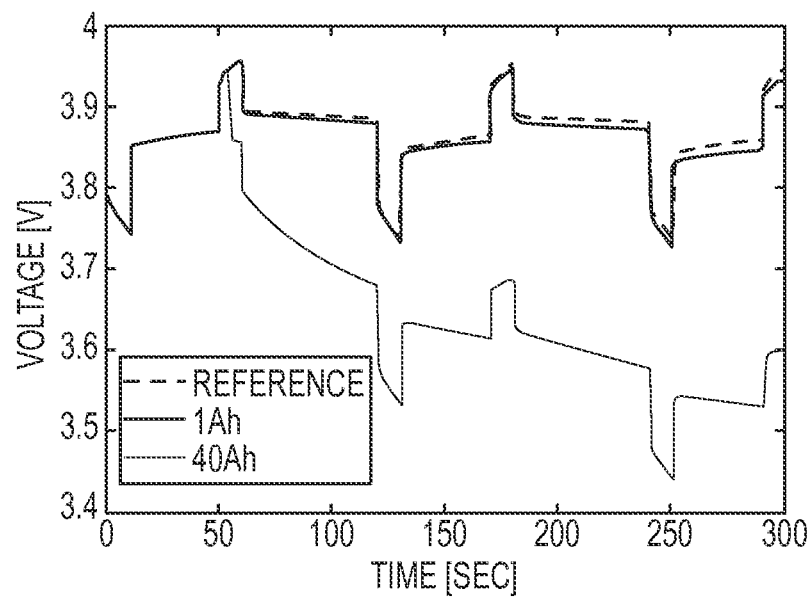
FIG. 6a depicts a model result comparison for output voltage responses of large (40 Ah) and small (1 Ah) capacity cells during pulse cycling (10 sec 5C discharge-40 sec rest-10 sec 3C charge-60 sec rest); 1Ω internal short circuit occurs during the first charge pulse at t=55 sec; Initial state of charge is set as 0.8.
Figure 6B:
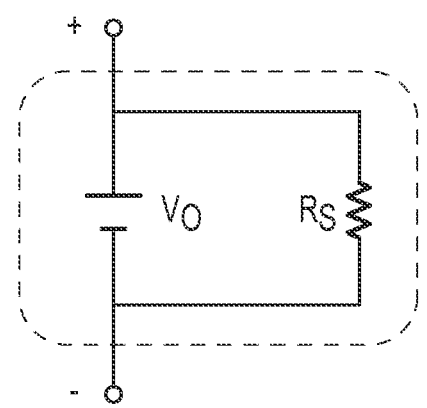

FIG. 6a depicts model simulation results of large-capacity, lithium-ion battery cell output voltage responses compared between 1 Ah and 40 Ah cells for an ISC occurring during pulse cycling of each cell. A schematic of the short-circuit cell model used in this study is shown in FIG. 6b. Electric response of a large-capacity battery cell is predicted by resolving the diffusion dynamics and charge transfer kinetics of the primary electrolyte, such as, fro example, lithium, using a model reduction technique. Model governing equations and input parameters are summarized in Table 1 and Table 2.

TABLE 1

Model governing equations

Conservation Equations:

| | | | Boundary Conditions: |
|---|---|---|---|
| Charge, Electrolyte Phase | $\frac{\partial}{\partial x}\left(\kappa^{eff}\frac{\partial}{\partial x}\phi_e\right) + \left(\kappa_D^{eff}\frac{\partial}{\partial x}\ln c_e\right) + j^{Li} = 0$ | (1) | $\left.\frac{\partial \phi_e}{\partial x}\right|_{x=0} = \left.\frac{\partial \phi_e}{\partial x}\right|_{x=L} = 0$ |
| Charge, Solid Phase | $\frac{\partial}{\partial x}\left(\sigma^{eff}\frac{\partial}{\partial x}\phi_s\right) - j^{Li} = 0$ | (2) | $-\left.\sigma_-^{eff}\frac{\partial \phi_s}{\partial x}\right|_{x=0} = \left.\sigma_+^{eff}\frac{\partial \phi_s}{\partial x}\right|_{x=L_-+L_{mp}+L_+} = \frac{1}{A}$, $\left.\frac{\partial \phi_s}{\partial x}\right|_{x=L_-} = \left.\frac{\partial \phi_s}{\partial x}\right|_{x=L_-+L_{mp}} = 0$ |
| Species, Electrolyte Phase | $\frac{\partial(\varepsilon_e c_e)}{\partial t} = \frac{\partial}{\partial x}\left(D_e^{eff}\frac{\partial}{\partial x}c_e\right) + \frac{1-t_+^o}{F}j^{Li}$ | (3) | $\left.\frac{\partial c_e}{\partial x}\right|_{x=0} = \left.\frac{\partial c_e}{\partial x}\right|_{x=L} = 0$ |
| Species, Solid Phase | $\frac{\partial c_s}{\partial t} = \frac{D_s}{r^2}\frac{\partial}{\partial r}\left(r^2\frac{\partial c_s}{\partial r}\right)$ | (4) | $\left.\frac{\partial c_s}{\partial r}\right|_{r=0} = 0, \; \left.D_s\frac{\partial c_s}{\partial r}\right|_{r=R_1} = \frac{-j^{Li}}{a_s F}$ |

Constitutive Relations:

| | | |
|---|---|---|
| Diffusional Conductivity | $\kappa_D^{eff} = \frac{2RT\kappa^{eff}}{F}(t_+^0 - 1)\left(1 + \frac{d\ln f_\pm}{d\ln c_e}\right)$ | (5) |
| Kinetics | $j^{Li} a_s i_o \left\{\exp\left[\frac{\alpha_a F}{RT}\eta\right] - \exp\left[-\frac{\alpha_c F}{RT}\eta\right]\right\}$ | (6) |
| | $\eta = \phi_s - \phi_e - U$ | (7) |
| | $i_0 = k(c_e)^{\alpha_a}(c_{s,max} - c_{s,e})^{\alpha_a}(c_{s,e})^{\alpha_c}$ | (8) |
| Bruggeman relations | $\kappa^{eff} = \kappa\epsilon_e^P, \; D_e^{eff} = \kappa D_e^P, \; \sigma^{eff} = \sigma\epsilon_s$ | (9-10) |

TABLE 2

Model parameters

| Parameter | $Li_xC_6$ Electrode | Separator | $Li_y(NCA)O_2$ Electrode |
|---|---|---|---|
| Thickness, δ [m] | $70.0 \times 10^{-6}$ | $25 \times 10^6$ | $50.0 \times 10^{-6}$ |
| Volume fraction active, $\epsilon_s$ | 0.51 | | 0.41 |
| Volume fraction electrolyte, $\epsilon_e$ | 0.4 | 0.4 | 0.4 |
| Maximum Li capacity, $c_{s,max}$ [mol m$^{-3}$] | $2.87 \times 10^4$ | | $4.90 \times 10^4$ |
| Specific area, [m$^2$ m$^{-3}$] | $3.010 \times 10^6$ | | $0.753 \times 10^6$ |
| Characteristic diffusion length, $R_s$ [m] | $5.083 \times 1.0^{-6}$ | | $1.6334 \times 10^{-6}$ |
| Stoichiometry at 0% SOC, $x_{0\%k\,y0\%}$ | 0.0712 | | 0.98 |
| Stoichiometry at 100% SOC, $x_{100\%k\,y100\%}$ | 0.63 | | 0.41 |
| Exchange current density, $i_o$[A m$^{-2}$] | 36.0 | | 4.0 |
| - activation energy, $E_{act}^{io}$ [J/mol] | $3.0 \times 10^4$ | | $3.0 \times 10^4$ |
| Charge-transfer coefficients, $\alpha_a, \alpha_c$ | 0.5, 0.5 | | 0.5, 0.5 |
| Film resistance, $R_{film}$ [Ω m$^2$] | 0 | | 0 |
| Solid diffusion coefficient, $D_s$ [m$^2$ s$^{-1}$] | $9.0 \times 10^{-14}$ | | $3 \times 10^{-15}$ |
| - activation energy, $E_{act}^{Ds}$ [J/mol] | $4.0 \times 10^3$ | | $2.0 \times 10^4$ |
| Solid conductivity, σ[S m$^{-1}$] | 100.0 | | 10 |
| Bruggeman tortuosity exponent, p | 2.0 | 2.0 | 2.0 |
| Electrolyte concentration, $c_e$ [mol m$^{-3}$] | | $1.2 \times 10^3$ | |
| Electrolyte phase Li$^+$ diffusion coefficient, $D_e$ [m$^2$ s$^{-1}$] | $D_e = 5.84 \times 10^{-7} \exp[-2870/T](c_e/1000)^2 - 33.9 \times 10^{-7} \exp[-2920/T](c_e/1000) + 129 \times 10^{-7} \exp[-3200/T]$ | | |
| Electrolyte ionic conductivity, K [S m$^{-1}$] | $K = 3.45 \exp[-798/T](c/1000)^3 - 48.5 \exp[-1080/T](c/1000)^2 + 244 \exp[-1440/T](c/1000)$ | | |
| Li+ transference number, $t_+^o$ | $t_+^o = -0.000267 \exp[883/T](c_e/1000)^2 + 0.00309 \exp[653/T](c_e/1000) + 0.517 \exp[-49.6/T]$ | | |
| Thermodynamic factor, $\partial \ln f_\pm / \partial \ln c_e$ | 0 | | |

| Parameter | Value |
|---|---|
| Negative Electrode, $U_-$ [V] | $U_-(x) = 0.124 + 1.5\exp(-70x) - 0.0351\tanh\left(\frac{x-0.286}{0.083}\right) - 0.0045\tanh\left(\frac{x-0.9}{0.119}\right) -$ |

TABLE 2-continued

Model parameters $$0.035\tanh\left(\frac{x-0.99}{0.05}\right) - 0.0147\tanh\left(\frac{x-0.5}{0.034}\right) - 0.102\tanh\left(\frac{x-0.194}{0.142}\right) -$$

$$0.22\tanh\left(\frac{x-0.98}{0.0164}\right) - 00.11\tanh\left(\frac{x-0.124}{0.0226}\right) + 0.0155\tanh\left(\frac{x-0.105}{0.029}\right)$$

| | |
|---|---|
| Positive Electrode, $U_+$ [V] | $U+ = 1.638\ x^{10} - 2.222\ x^9 + 15.056\ x^8 - 23.488\ x^7 + 81.246\ x^6 - 344.566\ x^5 + 621.3475\ x^4 - 554.774\ x^3 + 264.427\ x^2 - 66.3691\ x + 11.8058 - 0.61386\ \exp(5.8201\ x^{136.4})$ |

When a 1Ω resistance ISC occurs during the first charge pulse, the output voltage of the 1 Ah cell deviates significantly from its reference voltage, due to internal discharge. Therefore, using this voltage offset as an ISC fault signal is attainable in a 1 AH cell. For the 40 Ah cell, however, the magnitude of the voltage offset from its reference value is reduced greatly with increase of cell capacity to 40 Ah because of the cell's smaller impedance. In addition, the large electric charge capacity of the 40 Ah cell slows down the change of state of charge for internal discharge, resulting in slow change of voltage. Therefore, it takes longer for the voltage offset in a large capacity cell to grow to a meaningful magnitude for detection while the heat for an evolving ISC is accumulating in a cell. In addition, a typical battery management system incorporates fast-computing, low-fidelity circuit analogy models as an on-board battery reference model. When taken together with the small magnitude of the signal, the uncertainty of the reference value is another factor making it difficult to use voltage offset for timely detection of a fault in large capacity battery systems.

Electrical Isolation

Using circuit-breakers, electrical isolation of a fault, such as an ISC, prevents further electrical current feed from further energizing the fault. However, neither an active circuit-breaker nor a passive circuit-breaker is easily applicable to large capacity battery systems. Enacting an active circuit-breaker such as a switch must be preceded by sensing an occurrence of a fault. As set forth above, this is quite challenging in large capacity batteries. Therefore, difficulty of timely fault detection hinders adopting active circuit-breakers in large capacity batteries. Passive circuit-breakers such as fuses or positive temperature coefficients limit the fault current by opening the circuit when abnormally excessive current flows through the device. However, in large capacity battery systems, a fault electric current, even though it can be a large current, will not be excessively larger than the system's normal operation current. Large capacity batteries carry large operational current for delivering or storing high electric power. Therefore, properly applying or designing passive circuit breakers triggered by abnormally excessive current is not easy with large capacity battery systems.

Embodiments provided by the present disclosure present fail-safe designs for large capacity battery systems that address the issues and the difficulties discussed above. In various aspects, a pack ISC response model is provided to demonstrate the viability of the disclosed fail-safe designs against various design parameters and operation conditions. For the case of two branches, as shown in the embodiments depicted in FIGS. 8a and 8b, the fault signal (FS) can be calculated as the difference between the two branch currents:

$$FS = I_2 - I_1 \quad [\text{Eq. 1}]$$

Using this quantity for detection of a fault in a battery module comprising multiple cells has several advantages, namely:

1) the magnitude of the signal is typically large enough even for early stage high impedance ISC detection;
2) the reference value of the signal is readily known; and
3) the signal measured at the module terminals can determine the fault occurrence in any component cell of the module.

Uncertainty of conventional reference models for large-capacity battery systems causes difficulty in using output voltage as a fault signal. Embodiments provided by the present disclosure overcome this difficulty.

In a well-balanced module, the reference value of the fault signal is known regardless of whether the system is at rest or undergoing charge/discharge cycling ($FS_{ref}=0$ for Eq. 1) and this value can be readily determined by one or more current measurement sensors. It is appreciated that the addition of current measurement sensors to a large capacity battery system can add expense, however only a few numbers of measurements at the module terminals are required in order to monitor a fault behavior of the entire module. Therefore, a large number of cell-by-cell high spatial resolution sensing is not required with the present disclosure. The cost of adding current measurement sensors is therefore kept at a minimum. Moreover, the cost is quite insignificant when balanced with the increased level of safety that is provided by the disclosed fail-safe systems.

Pack ISC Response Model

Figure 9:
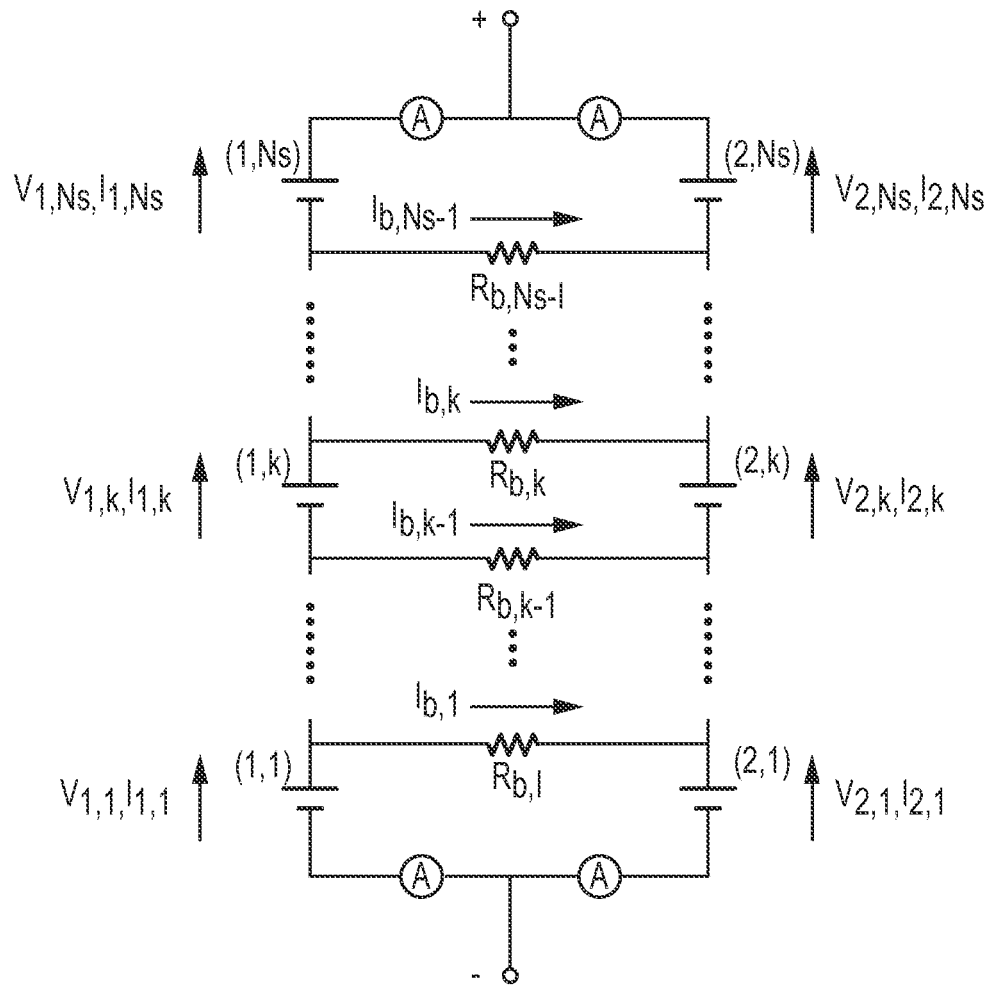
FIG. 9 depicts a circuit diagram of a 2-branch module with N, cells in series and the number notation of calculated quantities.

In various aspects, a pack ISC response model is provided by the present disclosure. A pack ISC response model developed for a 2-branch module according to the present disclosure is shown in FIG. 9, where the number of cells in series is $N_s$. This embodiment was employed in order to demonstrate the viability of the disclosed fail-safe designs against various design parameters and operation conditions. Current conservation at the nodes of the module gives:

$$I_{1,1} + I_{2,1} = I_{mdl} \quad [\text{Eq. 2}]$$

$$I_{1,k+1} + I_{b,k} = I_{1,k}\ (k=1,2\ldots,N_S-1) \quad [\text{Eq. 3}]$$

$$I_{2,k+1} + I_{b,k} = I_{2,k}\ (k=1,2\ldots,N_S-1) \quad [\text{Eq. 4}]$$

where $I_{mdl}$ is the output current at the module terminals. Energy conservation yields Kirchhoff's loop rule:

$$V_{1,1} - I_{b,1}R_{b,1} = V_{2,1} \quad [\text{Eq. 5}]$$

$$V_{1,k} - I_{b,k}R_{b,k} = V_{2,k} - I_{b,k-1}R_{b,k-1}\ (k=2,\ldots,N_S-1) \quad [\text{Eq. 6}]$$

$$V_{n,N_5} = V_{2,N_5} - I_{b,N_5-1}R_{b,N_b-1} \quad [\text{Eq. 7}]$$

where $R_{b,k}$'s are the resistance of the parallel balancing lines. Voltage-current relations are evaluated using the cell model suggested in FIG. 6b and Tables 1 and 2.

Pack ISC Simulation

Computer simulations for electric response of a pack developing an ISC were performed to confirm the viability of the disclosed fail-safe designs and to investigate the impacts of system design parameters and operation conditions.

Impact of ISC Resistance on Fault Signal

Figure 10A:
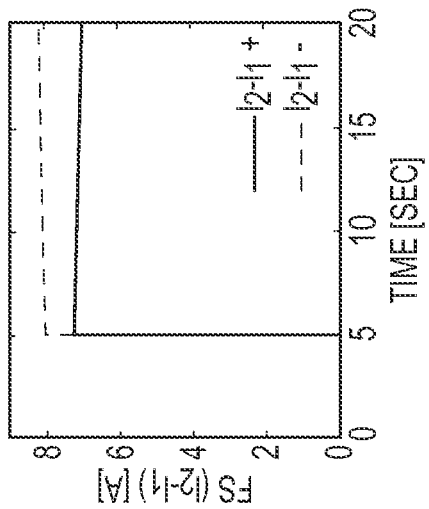
FIG. 10 depicts pack internal short circuit simulation results of fault signals (FS) at positive and negative module terminals for a 0.1Ω internal short circuit (FIG. 10a), a 0.5Ω internal short circuit (FIG. 10b) and for a 2Ω internal short circuit (FIG. 10c). In each depicted embodiment, the internal short circuit occurs at 5 seconds in cell(1, 2) of each module with conditions $C_{mdl}$=40 Ah (20 Ah+20 Ah), $I_{mdl}$=0 A, $N_s$=5 and $R_b$=0.1Ω.
Figure 10B:
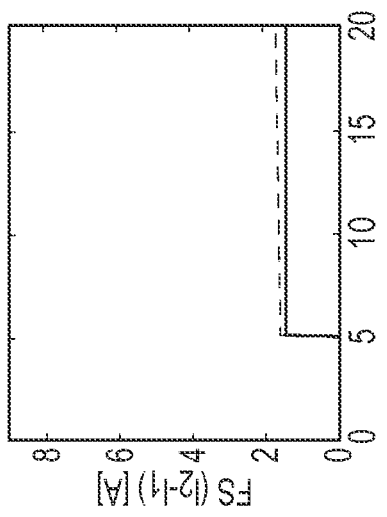
Figure 10C:
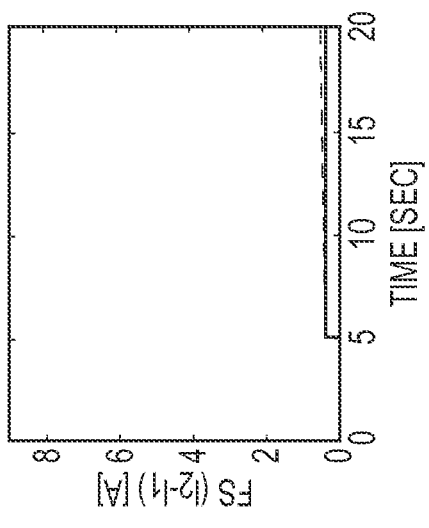

It is desirable to detect an ISC in the early stage when its electrical resistance is still relatively high, before it evolves into a low resistance, hard short. Therefore, it is important to know how the signal from the disclosed fail-safe designs for large capacity battery systems changes while ISC varies in a system. FIG. 10 presents the impact of ISC resistance on the fault signal suggested in Eq. 1 in the 2-branch module depicted in FIG. 9. The signals at positive and negative module terminals are plotted over time for a 0.1Ω ISC at FIG. 10a, for a 0.5Ω ISC at FIG. 10b, and for a 2Ω ISC at FIG. 10c. The capacity of the module was 40 Ah (20 Ah+20 Ah). The number of cells in series connection in the module was five. ISCs occurred at 5 seconds in the cell(1, 2) which is the 2nd cell in series from the negative terminal in the first branch as notated in FIG. 9. 0.1Ω resistors were placed in the parallel balancing lines. The module was at rest without charging or discharging during testing. As shown in FIG. 9, the magnitude of the signal was a strong function of the resistance of the induced ISC. Therefore, a pre-developed database providing the relationship between the signal and the resistance of an ISC can be used to determine the status of ISC evolution from an on-board control system. The sign of the signal tells the control system in which branch the ISC has occurred.

Impact of Module Output Current on Fault Signal

A viable signal of a fault should be detectable regardless of the use of a battery system. Simulated fault signals for a 0.1Ω ISC were compared for a module at rest in FIG. 11a, for a module at 3C-discharging in FIG. 11b, and for a module at 3C-charging in FIG. 11c. Other conditions are kept same as the previous case. The model results showed that module output current does not greatly affect the signal. Therefore, the signal database for system control is not necessarily developed as a function of a module output current. By way of example, a set of data collected from a module staying at rest can be applied to detection of a fault occurring in a module that is actively being cycled or a module being charged.

Impact of Number of Cells in Series in a Module on Fault Signal

Simulation results of fault signals at positive and negative terminals are shown for a module with 5-series cell strings in FIG. 12a, for a module with 10-series cell strings in FIG. 12b, and for a module with 20-series cell strings in FIG. 12c. Other conditions are kept same as the previous cases. The model results show that the magnitude of the signal decreases slowly as the number of cells in series in a module increases. This is largely due to the module impedance increase for more cells added in series string. The simulation results shown in FIG. 12 indicate that the signals from a module with 20 cells in series are still comparably large enough for the signal from a module with 5 cells in series.

Impact of Location of a Faulted Cell in a Module on Fault Signal

Figures 13A, 13B, 13C:
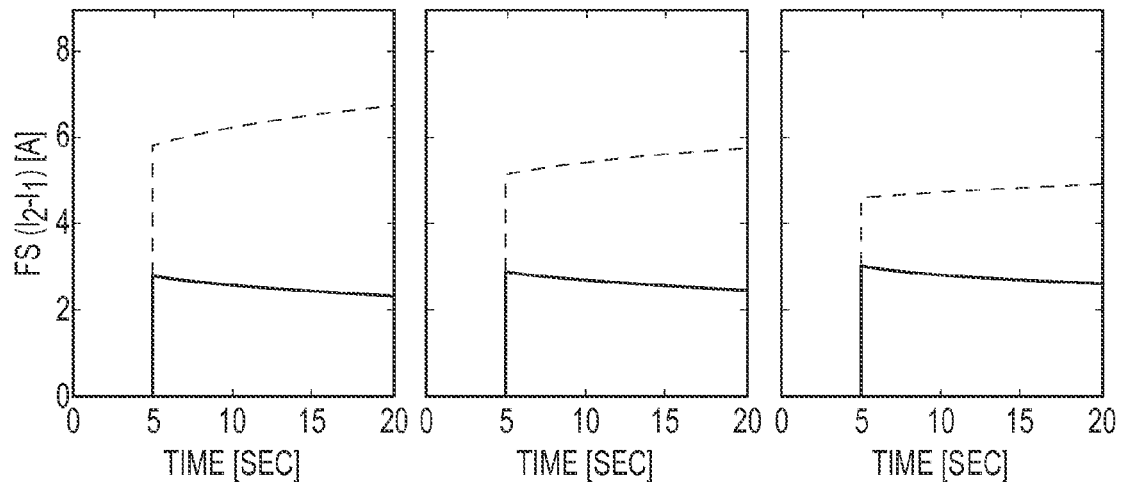
FIG. 13 depicts pack internal short circuit simulation results of fault signals (FS) at positive and negative module terminals for internal short circuit occurring at 5 seconds in cell(1, 1) (FIG. 13a), in cell(1,2) (FIG. 13b), in cell(1,3) (FIG. 13c), in cell(1,4) (FIG. 13d) and in cell(1,5) (FIG. 13e) of a module where $N_s$=10, $C_{mdl}$=40 Ah (20 Ah+20 Ah), $I_{mdl}$=0 A, $R_b$=0.1Ω and $R_s$=0.1Ω.
Figures 13D, 13E:
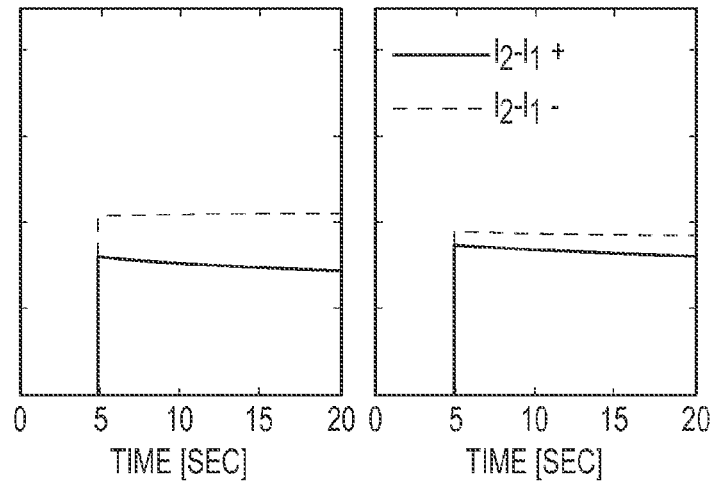

Simulation results of fault signals at positive and negative terminals are presented in FIG. 13a for a module with a fault at the cell first from the negative terminal in the left-hand side series branch shown in FIG. 9, for a module with a fault at the second cell in FIG. 13b, for a module with a fault at the third cell in FIG. 13c, for a module with a fault at the fourth cell in FIG. 13d, and for a module with a fault at the fifth cell in FIG. 13e. As can be seen, the signal is larger at the terminal where the faulted cell is closer. Therefore, the ratio of the signals at positive terminal and negative terminal varies with the location of a faulted cell in a module. Only two signals are measured at the terminals of a module consisting of two parallel branches with an arbitrary number of unit cells. However, the combination of the two signals provides sufficient information for identifying the faulted cell in a multi-cell module. As can be appreciated, once the faulted cell in a multi-cell module is detected, it can be electrically isolated from the remainder of the battery. Locating and isolating the defected cell in a module will allow better chance to address the fault locally.

Impact of Capacity and Rate Capability of a Module on Fault Signal

Figure 14B:
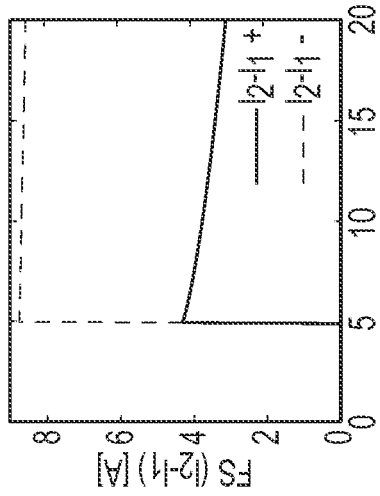
FIG. 14 depicts Pack internal short circuit simulation results of fault signals (FS) in a power cell module with 2 mΩ·m² pulse resistance for $C_{mdl}$=40 Ah (20 Ah+20 Ah) (FIG. 14a), 10 Ah (5 Ah+5 Ah) (FIG. 14b), and 4 Ah (2 Ah+2 Ah) (FIG. 14c); in an energy cell module with 8 mΩ·m² pulse resistance for $C_{mdl}$=40 Ah (20 Ah+20 Ah) (FIG. 14d), 10 Ah (5 Ah+5 Ah) (FIG. 14e), and 4 Ah (2 Ah+2 Ah) (FIG. 14f). For all cases, the internal short circuit occurs at 5 seconds in cell(1, 2) of each module with conditions $N_s$=5, $I_{mdl}$=0 A, $R_b$=0.1Ω and $R_s$=0.1Ω.
Figure 14C:
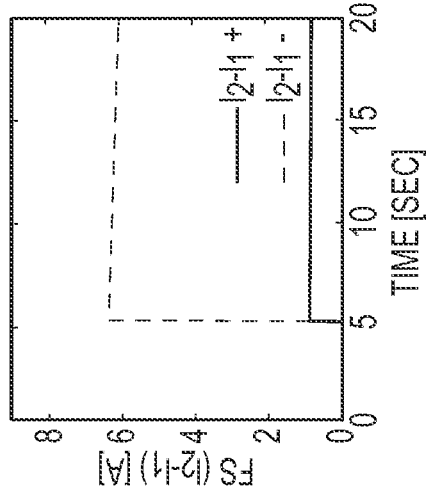
Figure 14E:
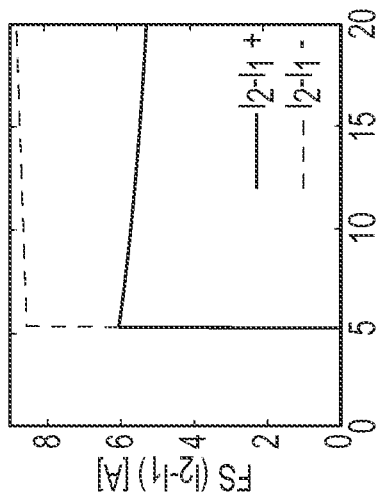
Figure 14F:
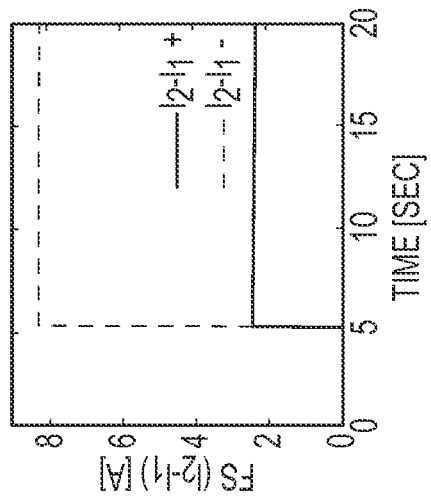
Figure 14A:
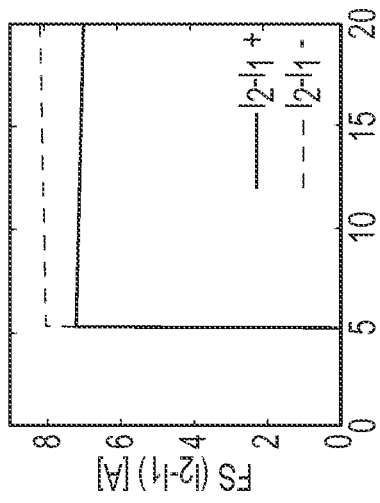
Figure 14D:
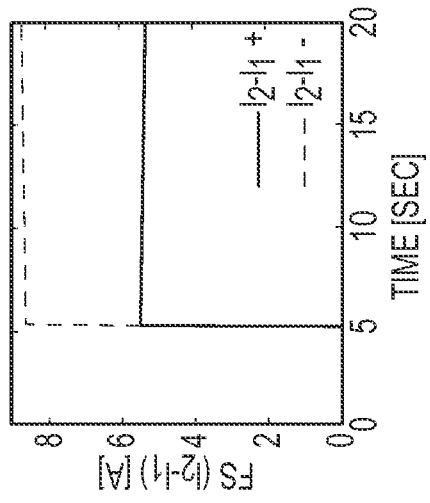

The requirements for energy content and maximum power of a large capacity battery system will vary with the characteristics of the applications and operational strategy. The power to energy ratio of large capacity batteries is typically established by selection of an appropriate unit cell design. In FIG. 14, the impact of module capacity and rate capability on the fault signal is disclosed. FIGS. 14a, 14b and 14c show simulated fault signals for modules using nominal cell designs specified in Tables 1 and 2. Module capacities are 40 Ah (20 Ah+20 Ah) in FIG. 14a, 10 Ah (5 Ah+5 Ah) in FIG. 14b, and 4 Ah (2 Ah+2 Ah) in FIG. 14c. Pulse resistance of these nominal module designs is 2 mΩ·m2 from the pulse discharge simulation. In FIGS. 14d, 14e, and 14f, model parameters are modified to simulate a low power module design with pulse resistance of 8 mΩ·m2. As discussed earlier, detection of a fault in large capacity batteries by sensing temperature excursion (FIG. 5) or output voltage change (FIG. 6) is extremely challenging for large capacity and high power systems. The fault signal provided by this disclosure, however, is easily detected for the larger capacity and a higher power modules. FIG. 14 shows that the average magnitude of the signal increases with the capacity and the power rate of the battery.

Impact on Joule Heating for Short Current Through ISC

Figure 15:
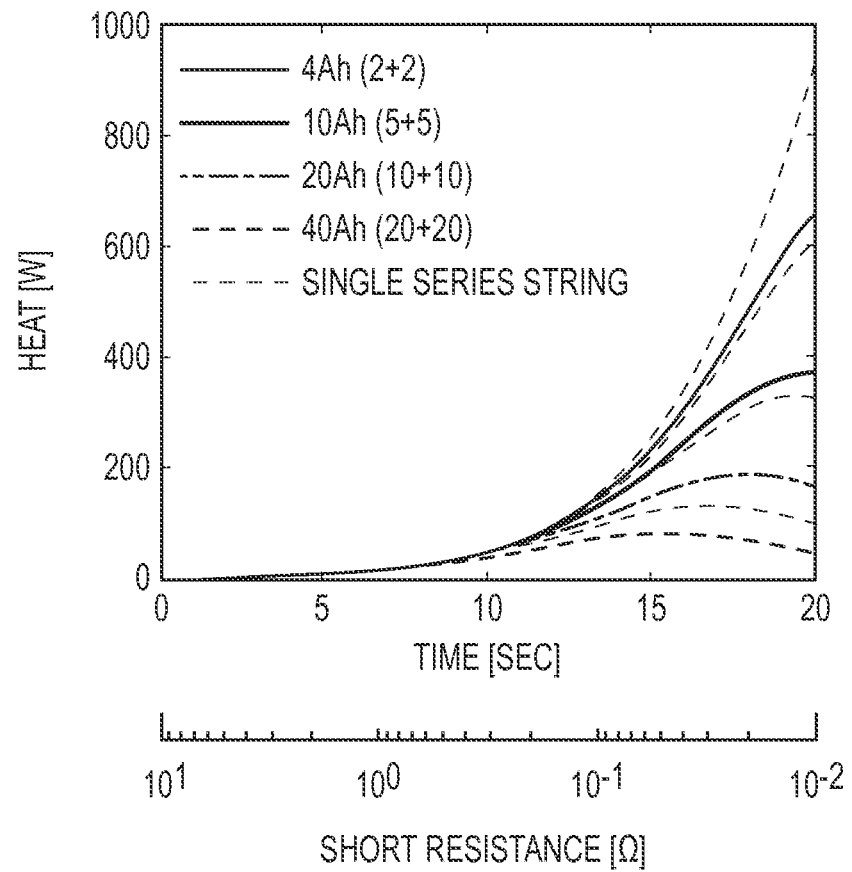
FIG. 15 depicts pack internal short circuit simulation results of short-circuit joule heat for evolving internal short circuits in modules with various capacities (indicated by solid lines) where an internal short circuit is induced in cell(1, 2); $N_s$=5, $I_{mdl}$=0 A, $R_b$=0.1Ω (solid lines) and $R_s$=0.1Ω (dotted lines).

The resistive parallel connections across the conductive series branches in the disclosed fail-safe designs effectively limit the amount of current offsetting the imbalance caused by an ISC. This greatly slows down the rate at which electrical energy is fed into a faulty cell from the other healthy cells in a module. In the event of an ISC, various sources of heat contribute to temperature increase in the system. The heat sources include, for example, joule heat due to electrical current converging at the short, electrochemical heat due to cell discharge, and heat released from exothermic decompositions, among others. Joule heat in conductive elements carrying the short current is typically localized close to a fault and is responsible for the initial thermal behavior of a system. FIG. 15 presents the pack ISC simulation results of short-circuit joule heat for evolving ISC in modules developing an ISC. Electrical resistance of a short will likely change with time, dictated by relations among component material properties and cell design characteristics. In the simulations shown in FIG. 15, a temporal function is arbitrarily chosen to represent ISC evolution with time:

$$R_S = 10^{(1-\frac{3t}{20})} \Omega. \quad [\text{Eq. 8}]$$

In Eq. 8, the short resistance decreases exponentially from 10Ω to 0.01Ω during 20 seconds of simulation time. FIG. 15 compares ISC joule heat for several two-branch modules with various capacities. Each case is also compared with ISC joule heat from single string modules of same capacities. The simulation results indicate that initially, while a short still remains as a high resistance ISC, the ISC joule heats are similar among all the tested cases. This is because, for large resistance shorts, the amount of short current that flows through an ISC is mainly determined by a short itself. However, once an ISC evolves into a low resistance short, short current starts to be limited by kinetics and transport in the battery. Therefore, joule heats for a short show significant departures among the cases when the ISC gets into a range of low resistances. For a low resistance short, a larger capacity battery can provide higher current for the ISC, thereby generating much higher joule heat around the short. On the other hand, joule heat for a similar short in a small capacity battery is much less. However, it should be noted that large overpotentials for kinetic and concentration limitations contribute a significant amount of heat during low resistance short discharge processes in small capacity batteries. The differences between the dotted line and the solid lines in FIG. 15 indicate the amount of reduction in ISC joule heat for corresponding module capacities. This implies that introducing a resistive balance path among parallel cell units significantly slows down electrical energy feed into a faulty cell from the other healthy cells in a module.

Fault Isolation

Electrical isolation of a fault is a common practice in a general electrical system to prevent the system from feeding electrical energy into a fault. However, in the case of a large capacity battery, it is difficult to make either an active circuit-breaker, such as a switch, and a passive circuit-breaker, such as a fuse, function properly, as stated earlier. However, embodiments provided by the present disclosure facilitate a methodology for detection of a fault even in large capacity batteries, thereby providing the opportunity to incorporate active circuit-breakers into large capacity batteries as a means of electrically isolating a faulty cell.

Figure 16C:
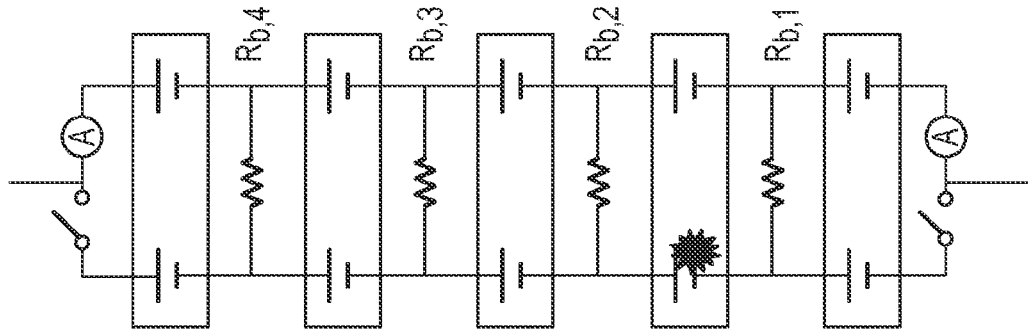
FIGS. 16a, 16b and 16c depict schemes for electrical isolation of a fault according to certain embodiments provided by the present disclosure.
Figure 16B:
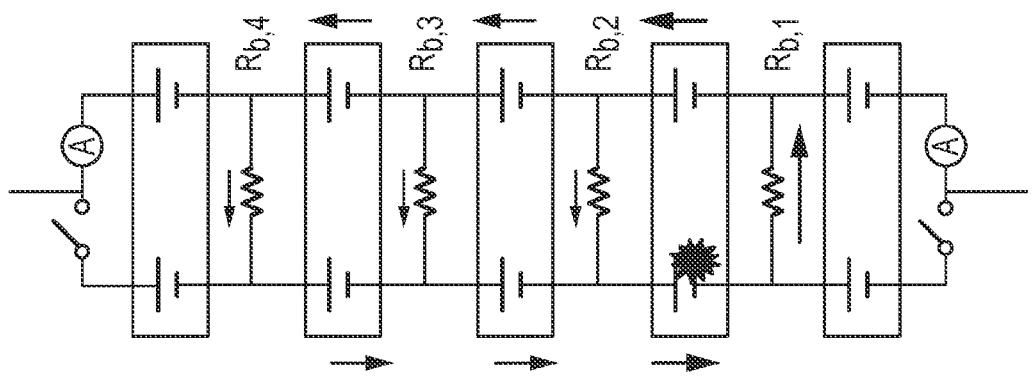
Figure 16A:
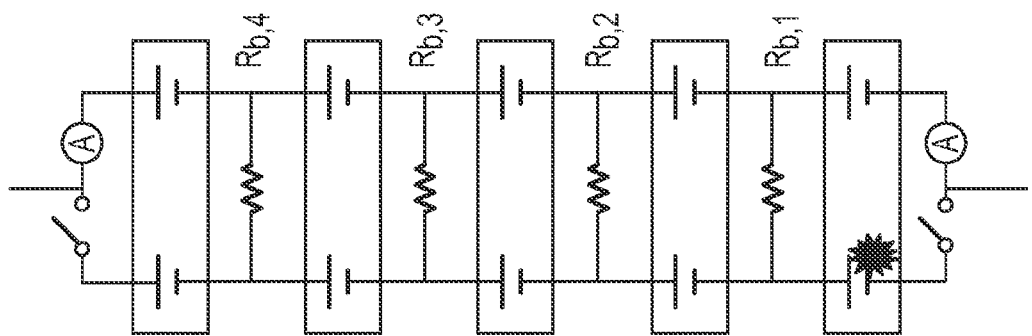

FIG. 16 illustrates isolation of faulted cells using a combination of active and passive circuit-breakers. In FIG. 16a, the ISC occurs at cell (1,1) which is directly connected to a module terminal. Once this fault is detected using the signal suggested in Eq. 1, the faulted series branch can be disconnected from the module terminals by opening the switches at the terminals as illustrated in FIG. 16a. If the fault occurs at the cell connected to one of the terminals, the faulted cell is immediately electrically isolated as soon as the switches are open.

If, however, a fault occurs in a cell that is not directly connected to a terminal (FIG. 16b), the fault is not immediately isolated when the faulted branch is disconnected from the terminals. When the switches are still closed, fault-feeding system current is mostly carried by conductive power-lines along series branches. Once the switches are open, the system fault current is carried through the balance line resistors as seen in FIG. 16b. Since the system fault current flowing through the balance line resistors is now much larger than the normal balance current, a passive circuit-breaker, such as a fuse, can be applied to open the balance lines. Once the balance lines on either side of the faulted cell open, the cell becomes electrically isolated as illustrated in FIG. 16c.

Figure 17A:
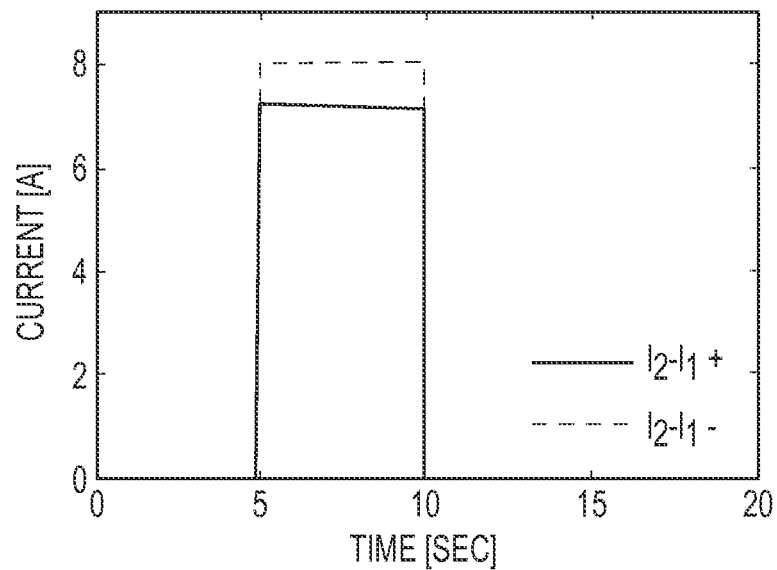
FIG. 17 depicts pack internal short circuit simulation results of fault signals (FS) at positive and negative module terminals (FIG. 17a), and balance resistor currents for a 0.10 internal short circuit (FIG. 17b). Internal short circuit occurs at 5 seconds in cell(1, 2) of the module with conditions $C_{mdl}$=40 Ah (20 Ah+20 Ah), $N_s$=5, $I_{mdl}$=0 A and $R_b$=0.1Ω. The faulted series branch is disconnected by opening switches at module terminals at 10 seconds.
Figure 17B:
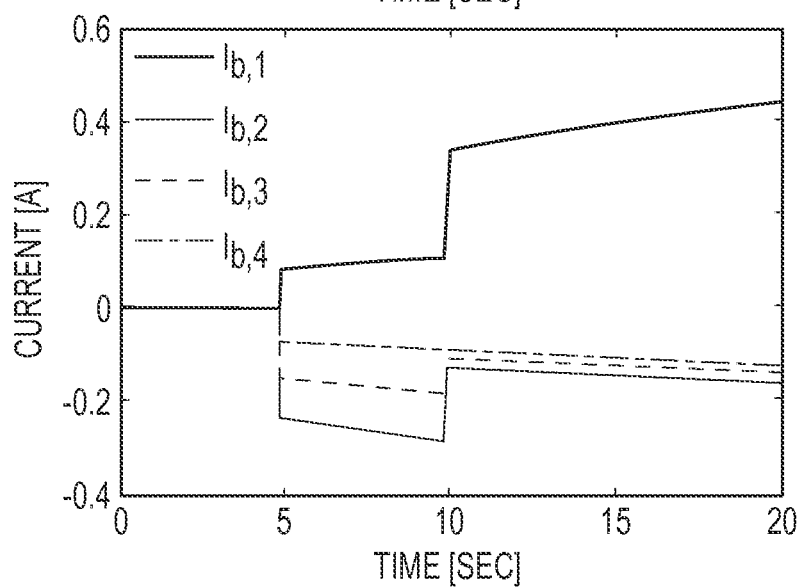

FIG. 17 shows simulations of the system response when the faulted branch in FIG. 16b becomes disconnected. In the simulated case, an ISC occurs at 5 seconds in the cell (1,2) of a 40 Ah (20 Ah+20 Ah) module. Balancing lines use 0.1Ω resistors. The number of cells in a series branch is five. The signals at positive and negative module terminals are plotted in FIG. 17a for a 0.1Ω ISC. The faulted branch is disconnected from the module terminals by opening the switches on the branch at 10 seconds. The balance line currents during the short event simulated are shown in FIG. 17b. The balance resistor currents are an order of magnitude smaller than the fault signal current. This implies that current induced by a fault is mostly carried by conductive series branches through the module terminals, as intended. Since the module is well balanced initially, the balance lines do not carry current until an ISC occurs at 5 seconds. When the terminal switches are open at 10 seconds, the resistor $R_{b,1}$ starts to carry the largest current in order for the sum of the resistor currents to be zero. If electric fuses are applied in the balance resistors, $R_{b,1}$ will open first, isolating the faulted cell (1,2). Once the faulted cell is successfully electrically isolated, the subsequent behavior of the faulted cell depends on the characteristics of individual unit cell, and not on the pack or module assembly characteristics. Therefore, pack safety issues can be reduced to designing a safe unit cell. As inferred from diagrams in FIG. 16, the multiple series-branch configurations provided by the present disclosure allow for partial power delivery from the pack even after the local shut-down of fault isolation is executed.

Experimental Demonstration

The following experimental demonstration describes in detail the preparation and properties of embodiments of the fail-safe systems and methods of the present disclosure. It will be apparent to those skilled in the art that many modifications, both to materials and methods, may be practiced without departing from the scope of the disclosure.

Figure 18:
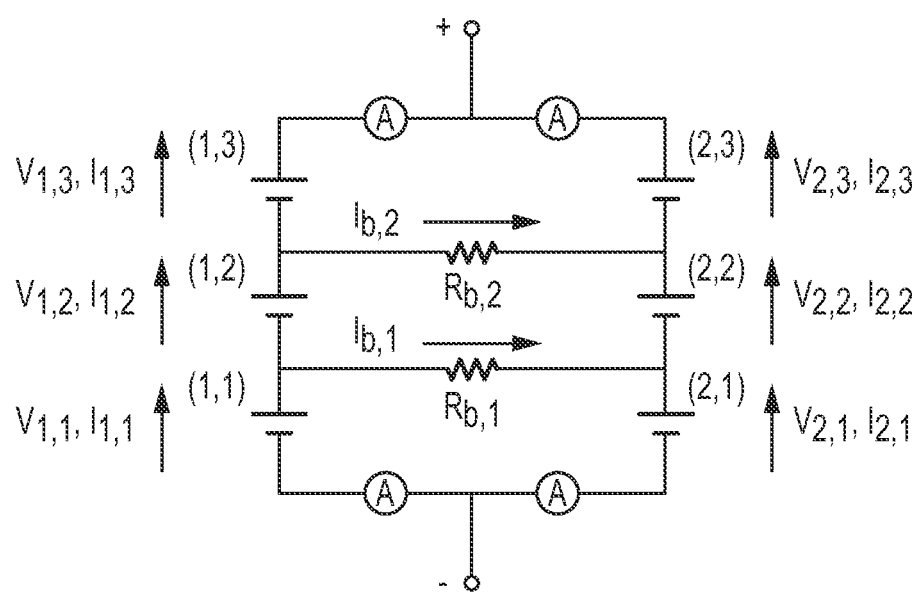
FIG. 18 depicts the circuit diagram of experimental set-up for the Experimental Demonstration model disclosed herein.

An experimental setup was generated to demonstrate the viability of the fail-safe designs provided by the present disclosure. The demonstration module consisted of two parallel sets of three Dow Kokam 8 Ah SLPB75106100 lithium polymer cells in series as shown in FIG. 18. Balance resistors with appropriate power ratings for short circuit balancing were interchanged for different test cases. To simulate short conditions, power resistors with various ohmic ratings were connected across the terminals of the shorted cell via a relay. All test cases were conducted with the cells fully charged and with an initial voltage variation of no more than 10 mV.

For this series of tests, all measurements were taken during rest, with no charge or discharge current applied to the test module. Data was acquired with a National Instruments Compact DAQ using Labview software. Measurements were taken at 1 second intervals for all points. Measurements included cell voltages, shunt voltages, and balance resistor voltages. Four 10 A current shunts were installed at the four corners of the module terminals as shown in FIG. 18. Both the balance and short resistors were within 1% tolerance to ensure the accuracy of the test results. Tests were composed of ten seconds of static data followed by a short event.

FIGS. 19a through 19l present measured fault signals (Eq. 1) from twelve separate experiments for which the faulted-cell location in the module, ISC resistance, and balance resistance were individually varied. Table 3 summarizes the values of the parameters for the twelve cases presented. FIGS. 19a, 19b and 19c compare the signals from different resistance shorts, 0.1Ω, 0.5Ω, and 1Ω ISCs, when a short occurs in the cell (1,1) with 0.2Ω balance resistors between the series branches.

As expected from model predictions, the magnitude of the fault signal was a strong function of the ISC resistance and the magnitude of the fault signal was larger at the negative terminal because it was closer to the faulty cell than the positive terminal. The fault signals are therefore clearly detected even for a 1Ω ISC which represents a short in its early stage of evolution.

FIGS. 19*d*, 19*e* and 19*f* present the same cases for a short occurring in cell (1,2). Since the faulty cell was located at the exact middle of the module, the fault signals measured at the positive and negative terminals were shown to be identical.

FIGS. 19*g*, 19*h* and 19*i* present same cases for a short occurring in cell (1,3). In these cases, the faulty cell was closer to the positive terminal of the module, producing a larger signal at the positive side than at the negative side. Compared with the cases shown in FIGS. 19*a*, 19*b* and 19*c*, the signals from positive and negative sides of the module are interchanged due to the symmetry of the locations of the faults in the module.

FIGS. 19*j*, 19*k* and 19*l* present the same cases shown in FIGS. 19*g*, 19*h* and 19*i* except that the resistance of balance resistors was reduced to 0.1Ω. Since the balance resistors carry increased current in the positive direction for the sign denoted in FIG. 18, the fault signal from the positive side of the module increased in magnitude, while it decreased at the negative side of the module.

The balance resistor currents are plotted in FIG. 20. The magnitudes and signs of the balance currents are functions of the faulted-cell location, resistance of balance resistors, and ISC resistance. The currents of balance resistors were an order of magnitude smaller than the fault signals measured at the module terminals. Overall, the data presented by the experimental demonstration confirms the model analysis for the functionality and the viability of the disclosed fail-safe designs and methods for large capacity lithium-ion battery systems.

Therefore, fail-safe designs for large capacity battery systems are presented. The disclosed designs separate the distinctive functions of electric pathways in large capacity batteries by carrying large electric current along conductive series branches and by carrying moderate parallel balance current across resistive balance lines. This facilitates a robust methodology for early stage detection and isolation of a fault in large capacity batteries, enhancing their safety. The aggrandized fault signal can be easily detected using measurements at the module terminals when a fault occurs in one of the unit cells. A pack ISC response model analysis reveals that the magnitude of the signal is a strong function of the resistance of an ISC induced. The module output current does not greatly affect the fault signal. The magnitude of the signal decreases slowly as the number of cells in series in a module increases. The ratio of the signals at the positive terminal and the negative terminal varies with the location of a faulted cell in a module. The fault signal is easier for sensing from a larger capacity and a higher power module.

Therefore, using the fault signal from the disclosed fail safe designs, the status of ISC evolution in a large capacity battery system can be readily determined, in some embodiments by a vehicle's on-board battery management system, and the defected cell in a module can be located to address the fault locally. In addition, a faulty cell can be electrically isolated using active and passive circuit breakers with the disclosed fail-safe designs to prevent the system from feeding further electrical energy into the fault. Once the faulty cell is successfully electrically isolated, the subsequent behavior of the faulted cell depends on the characteristics of that individual unit, and not on the pack assembly characteristics. Experimental demonstration confirms the findings from the pack ISC model analysis and demonstrates the viability of the disclosed fail-safe designs.

Finally, it should be noted that there are alternative ways of implementing the embodiments disclosed herein. While a number of exemplary aspects and embodiments have been discussed above, those of skill in the art will recognize certain modifications, permutations, additions and sub combinations thereof. Accordingly, the present embodiments are to be considered as illustrative and not restrictive. Furthermore, the claims are not to be limited to the details given herein, and are entitled their full scope and equivalents thereof.

The invention claimed is:

1. A battery pack, comprising:
   a plurality of cells arranged between a positive and a negative terminal;
   a plurality of power lines that interconnect the plurality of cells in an array of parallel branches;
   a plurality of balancing lines between the parallel branches, each balancing line configured to carry a balancing current between adjacent branches and each having a resistance that is calibrated to force the balancing current onto the power lines when the balancing current increases due to an internal short circuit in a cell to which that balancing line is connected;
   a plurality of current meters connected to the power lines, the plurality of current meters configured to output a plurality of fault signals at least one of which departs from a reference value when the resistance of the balancing lines forces the balancing current onto the power lines;
   a plurality of switches, each of which is connected to one of the parallel branches of cells and is configured to open if the fault signal for the branch to which the switch is connected departs from the reference value; and
   a plurality of fuses, each of which is connected to one of the balancing lines and is configured to open when the balancing current in the balancing line to which the fuse is attached exceeds a predetermined threshold, wherein:
   when a particular switch opens, the particular switch disconnects the corresponding positive terminal or the corresponding negative terminal from the parallel branch of cells to which it is connected.

2. The battery pack of claim 1, wherein when a particular switch opens, the balancing current into the cell having an internal short circuit increases beyond the predetermined threshold and causes the fuse attached to the balancing line that carries the increased balancing current to open, electrically isolating the cell with the internal short circuit.

3. The battery pack of claim 1, wherein the fault signal is calculated for each branch of cells as the difference between the current for that branch and the average current for all branches in the array of cells.

4. The battery pack of claim 3, wherein the reference value of the fault signal for each branch in the cell array is zero.

5. The battery pack of claim 1, wherein the plurality of current meters comprises a first set of current meters each of which is connected to one of the parallel branches of cells between a first cell in the parallel branch and the positive terminal, the first set of current meters configured to output a positive fault signal.

6. The battery pack of claim 5, wherein the plurality of current meters comprises a second set of current meters each of which is connected to one of the parallel branches of cells between a last cell in the parallel branch and the negative terminal, the second set of current meters configured to output a negative fault signal.

7. The battery pack of claim 1, wherein the plurality of switches comprises a first set of switches, each of which is connected to one of the parallel branches of cells between a first cell in that branch and the positive terminal, wherein when a particular switch in the first set of switches opens, that switch disconnects the positive terminal from the parallel branch to which the switch is connected.

8. The battery pack of claim 7, wherein the plurality of switches comprises a second set of switches, each of which is connected to one of the parallel branches of cells between a last cell in that branch and the negative terminal, wherein when a particular switch in the second set of switches opens, that switch disconnects the negative terminal from the parallel branch to which the switch is connected.

9. A battery system, comprising:
a cell array having a plurality of cells arranged in branches that are connected in parallel;
a monitor connected to the cell array such that the monitor receives an input signal for each branch in the cell array and outputs a control signal for each branch in the cell array responsive to the input signals, the monitor configured to assert the control signal for a particular branch if the input to the monitor indicates a fault for that particular branch;
a plurality of switches each of which is connected to one branch in the cell array and connected to the monitor such that the switch receives the control signal as input, each switch being configured to open when the control signal to which that switch is attached is asserted;
a plurality of current meters each of which is connected to one branch in the cell array, each current meter configured to output a current signal that indicates an amount of current present in the branch to which the current meter is connected;
a plurality of balancing lines between the parallel branches, each balancing line configured to carry a balancing current between adjacent branches of cells and each having a resistance that is calibrated to force the balancing current onto the power lines when the balancing current increases due to an internal short circuit in a cell to which that balancing line is connected; and
a plurality of fuses on each of the balancing lines, each fuse configured to open when the balancing current in the balancing line to which the fuse is attached exceeds a predetermined threshold, wherein:
the monitor asserts the control signals based on fault signals that are derived from the current signals output from the current meters, and
the balancing current on the power lines causes an increase in the output of at least one, but not all of the current meters.

10. The battery system of claim 9, wherein the monitor is configured to receive the current signals as input, to calculate the fault signal for each branch in the cell array as the difference between the current for that branch and the average current for all branches in the array of cells, and to assert the control signal on a particular branch if the fault signal for that particular branch departs from a reference value.

11. The battery system of claim 9, comprising:
a circuit element connected to the plurality of current meters and to the monitor, the circuit element configured to output a fault signal for each branch in the cell array, the fault signal being the difference between the current for that branch and the average current for all branches in the array of cells;
wherein the monitor is configured to receive the fault signals as input, and to assert the control signal on a particular branch if the fault signal for that particular branch departs from a reference value.

12. The battery system of claim 9, wherein when a particular switch opens, the balancing current into the cell having the internal short circuit increases beyond the predetermined threshold and causes the fuse attached to the balancing line that carries the increased balancing current to open, thereby electrically isolating the cell having the internal short circuit.

13. The battery system of claim 9, comprising:
a battery enclosure that encloses the cell array and the monitor.

14. The battery system on claim 9, comprising:
a battery enclosure that encloses the cell array;
wherein the monitor is external to the enclosure.

* * * * *